(12) United States Patent
Park et al.

(10) Patent No.: US 11,495,713 B2
(45) Date of Patent: Nov. 8, 2022

(54) PIXEL AND DISPLAY DEVICE INCLUDING THE SAME

(71) Applicant: Samsung Display Co., Ltd., Yongin-si (KR)

(72) Inventors: Chan Jae Park, Yongin-si (KR); Haeng Won Park, Yongin-si (KR); Sang Duk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 17/122,976

(22) Filed: Dec. 15, 2020

(65) Prior Publication Data

US 2021/0336088 A1     Oct. 28, 2021

(30) Foreign Application Priority Data

Apr. 27, 2020   (KR) .................. 10-2020-0051030

(51) Int. Cl.
*H01L 33/38* (2010.01)
*H01L 33/62* (2010.01)
*H01L 27/15* (2006.01)

(52) U.S. Cl.
CPC .......... *H01L 33/387* (2013.01); *H01L 27/156* (2013.01); *H01L 33/62* (2013.01)

(58) Field of Classification Search
CPC ..... H01L 33/387; H01L 27/156; H01L 33/62; H01L 25/167; H01L 33/60; H01L 25/0753; H01L 27/3248; H01L 27/3276; H01L 27/124; H01L 27/1248; G09G 3/3258
See application file for complete search history.

(56) References Cited

U.S. PATENT DOCUMENTS

| | | | |
|---|---|---|---|
| 8,035,120 B2 * | 10/2011 | Ito | H01L 33/58 257/E33.068 |
| 9,865,577 B2 | 1/2018 | Bibl et al. | |
| 10,135,034 B1 | 11/2018 | Bita et al. | |
| 2013/0213697 A1 * | 8/2013 | Palaniswamy | H01L 33/486 174/254 |
| 2013/0294471 A1 * | 11/2013 | Palaniswamy | H01S 5/024 257/79 |
| 2018/0019369 A1 * | 1/2018 | Cho | H05K 1/11 |

(Continued)

FOREIGN PATENT DOCUMENTS

| | | |
|---|---|---|
| KR | 10-1108403 B1 | 1/2012 |
| KR | 10-1961209 B1 | 3/2019 |

(Continued)

*Primary Examiner* — Victor A Mandala
(74) *Attorney, Agent, or Firm* — Lewis Roca Rothgerber Christie LLP

(57) ABSTRACT

A pixel includes a first electrode and a second electrode spaced from each other in a first direction on a substrate; a plurality of light emitting elements between the first electrode and the second electrode; an intermediate pattern located between the first electrode and the second electrode in the first direction and located between the substrate and the plurality of light emitting elements in a thickness direction of the substrate; a first contact electrode electrically connecting one end portion of each of the light emitting elements and the first electrode; and a second contact electrode electrically connecting an other end portion of each of the light emitting elements and the second electrode.

20 Claims, 18 Drawing Sheets

(56) References Cited

U.S. PATENT DOCUMENTS

| | | | | |
|---|---|---|---|---|
| 2021/0273131 A1* | 9/2021 | Kang | .................. | H01L 25/0753 |
| 2021/0288033 A1* | 9/2021 | Lim | ....................... | H01L 33/08 |
| 2021/0358393 A1* | 11/2021 | Kang | ..................... | H01L 33/62 |
| 2021/0359166 A1* | 11/2021 | Jung | .................... | H01L 33/005 |
| 2021/0367183 A1* | 11/2021 | Lim | ................... | H01L 51/5209 |
| 2021/0375194 A1* | 12/2021 | Kwag | ...................... | G09G 3/32 |
| 2021/0376196 A1* | 12/2021 | Lee | ...................... | H01L 33/387 |

FOREIGN PATENT DOCUMENTS

| | | |
|---|---|---|
| KR | 10-2053217 B1 | 1/2020 |
| WO | WO 2004/053934 A2 | 6/2004 |

* cited by examiner

PIXEL AND DISPLAY DEVICE INCLUDING THE SAME

CROSS-REFERENCE TO RELATED APPLICATION

This application claims priority to and the benefit of Korean Patent Application No. 10-2020-0051030 filed in the Korean Intellectual Property Office on Apr. 27, 2020, the entire content of which is incorporated herein by reference.

BACKGROUND

1. Field

The present disclosure relates to a pixel and a display device including the same.

2. Description of the Related Art

With the increased interest in information displays and the high demand for portable information media, display devices have been in high demand accordingly, and commercialization of display devices has been intensified.

The above information disclosed in this Background section is only for enhancement of understanding of the background of the disclosure, and therefore it may contain information that does not form prior art.

SUMMARY

The present disclosure has been made in an effort to provide a pixel and a display device including the same that may improve a light emission efficiency of light emitted from a light emitting element by disposing an intermediate pattern between the light emitting element and a substrate.

One or more example embodiments of the present disclosure may provide a pixel including: a first electrode and a second electrode spaced from each other in a first direction on a substrate; a plurality of light emitting elements between the first electrode and the second electrode; an intermediate pattern located between the first electrode and the second electrode in the first direction and located between the substrate and the plurality of light emitting elements in a thickness direction of the substrate; a first contact electrode electrically connecting one end portion of each of the light emitting elements and the first electrode; and a second contact electrode electrically connecting other end portion of each of the light emitting elements and the second electrode. Here, one side of the intermediate pattern may be spaced from the first electrode with a first gap therebetween in the first direction, and other side of the intermediate pattern may be spaced from the second electrode with a second gap therebetween in the first direction. The intermediate pattern may include a same material as that of the first and second electrodes.

In a plan view, the intermediate pattern may overlap the light emitting elements.

The first and second electrodes and the intermediate pattern may be provided at a same layer.

The first gap and the second gap may be same as or different from each other.

Each of the first and second gaps may be smaller than a length of each of the light emitting elements parallel to an extending direction of each of the light emitting elements. A width of the intermediate pattern in the first direction may be greater than the length of each of the light emitting elements.

The pixel may further include an insulating layer on the first and second electrodes and the intermediate pattern and under the light emitting elements. Here, the insulating layer may expose a portion of the first electrode and a portion of the second electrode, and may completely cover the intermediate pattern.

The intermediate pattern may be covered by the insulating layer to be electrically insulated from the first electrode, the second electrode, the first contact electrode, and the second contact electrode.

The intermediate pattern may reflect light emitted from each of the light emitting elements in one direction.

The pixel may further include a first bank pattern between the substrate and the first electrode, and a second bank pattern between the substrate and the second electrode. Here, the one side of the intermediate pattern may correspond to the first bank pattern, and the other side of the intermediate pattern may correspond to the second bank pattern.

The first electrode and the one side of the intermediate pattern may be spaced from each other with the first gap therebetween on the first bank pattern, and the second electrode and the other side of the intermediate pattern may be spaced from each other with the second gap therebetween on the second bank pattern.

The pixel may further include a first dummy pattern spaced from the first electrode in the first direction, and a second dummy pattern spaced from the second electrode in the first direction.

Here, the first electrode may be located between the first dummy pattern and the intermediate pattern in a plan view. The second electrode may be located between the second dummy pattern and the intermediate pattern in a plan view.

The first and second dummy patterns may include the same material as that of the first and second electrodes, and may be at the same layer as the first and second electrodes.

The insulating layer may be on the first and second dummy patterns to completely cover the first and second dummy patterns. Here, the first and second dummy patterns may reflect light emitted from the light emitting elements in the one direction.

Another embodiment of the present disclosure may provide a display device including: a plurality of pixels on a substrate. Each of the pixels may include a first electrode and a second electrode spaced from each other in a first direction on the substrate; a plurality of light emitting elements between the first electrode and the second electrode; an intermediate pattern located between the first electrode and the second electrode in the first direction and located between the substrate and the plurality of light emitting elements in a thickness direction of the substrate; a first contact electrode electrically connecting one end portion of each of the light emitting elements and the first electrode; and a second contact electrode electrically connecting an other end portion of each of the light emitting elements and the second electrode. Here, one side of the intermediate pattern may be spaced from the first electrode with a first gap therebetween in the first direction, and an other side of the intermediate pattern may be spaced from the second electrode with a second gap therebetween in the first direction.

The intermediate pattern may include a same material as that of the first and second electrodes.

According to one or more example embodiments of the present disclosure, it is possible to increase an amount of light progressed in an image display direction by disposing an intermediate pattern between a light emitting element and a substrate such that light emitted from the light emitting element to a direction of the substrate is reflected in the image display direction (or a front direction) by using the intermediate pattern. Therefore, a pixel with improved light emission efficiency and a display device including the same may be provided.

An effect according to one or more example embodiments of the present disclosure is not limited by what is illustrated in the above, and more various effects are included in the present specification.

DETAILED DESCRIPTION

Figure 1A:
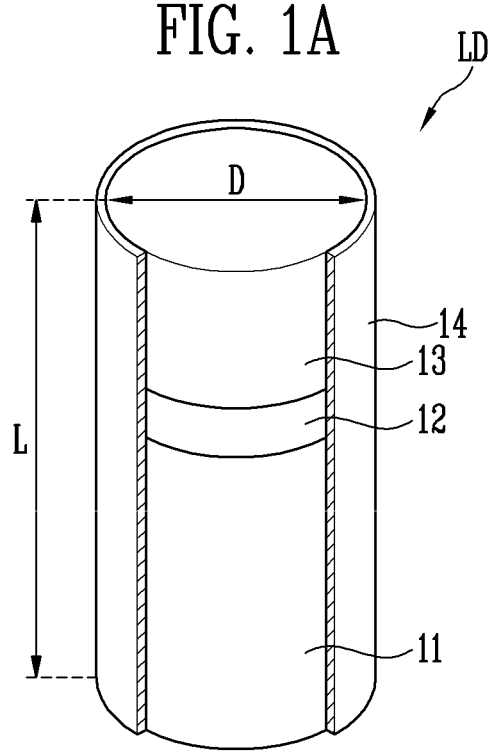
FIG. 1A schematically illustrates a perspective cutaway view of a light emitting element according to one or more example embodiments of the present disclosure.

Because the present disclosure may be variously modified and have various forms, embodiments will be illustrated and described in detail in the following. This, however, by no means restricts the disclosure to the specific embodiments, and it is to be understood as embracing all included in the spirit and scope of the present disclosure changes, equivalents, and substitutes.

Like reference numerals are used for like constituent elements in describing each drawing. In the accompanying drawings, the dimensions of the structure are exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure. Singular forms are intended to include plural forms unless the context clearly indicates otherwise.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, or substrate is referred to as being "on" another element, it can be directly on the other element or intervening elements may also be present. In addition, in the present specification, when a portion of a layer, film, region, plate, or the like is referred to as being formed "on" another portion, the formed direction is not limited to an upper direction but includes a lateral or lower direction. In contrast, when a portion of a layer, film, region, plate, or the like is referred to as being "below" another portion, it may be directly below the other portion, or intervening portions may be present.

It is to be understood that, in the present application, when it is described for one element (for example, a first element) to be (functionally or communicatively) "coupled or connected with/to" another element (for example, a second element), the one element may be directly coupled or connected with/to the another element, or may be coupled or connected with/to through the other element (for example, a third element). In contrast, it may be understood that when it is described for one element (for example, a first element) to be "directly coupled or connected with/to" another element (for example, a second element), there is no other element (for example, a third element) between the one element and the another element.

Hereinafter, with reference to accompanying drawings, a preferred embodiment of the present disclosure and others required for those skilled in the art to understand the contents of the present disclosure will be described in more detail. In the description below, singular forms are to include plural forms unless the context clearly indicates only the singular.

Figure 1B:
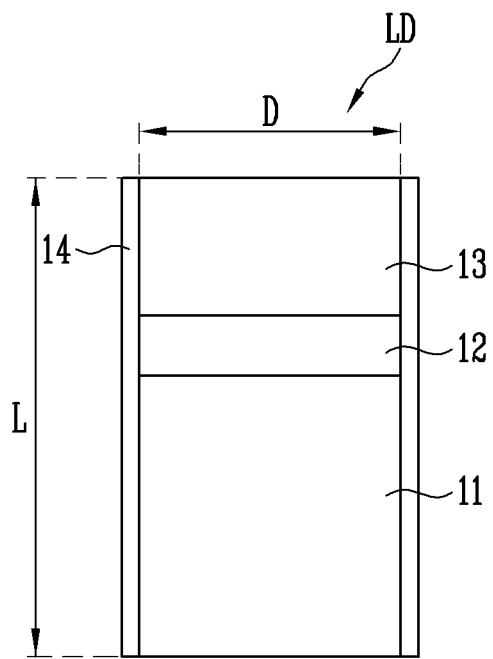
FIG. 1B illustrates a cross-sectional view of the light emitting device of FIG. 1A.
Figure 2A:
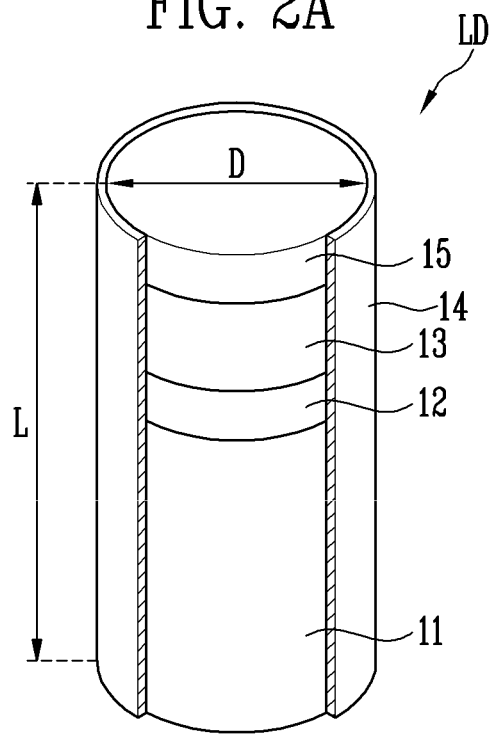
FIG. 2A schematically illustrates a perspective cutaway view of a light emitting element according to another example embodiment of the present disclosure.
Figure 2B:
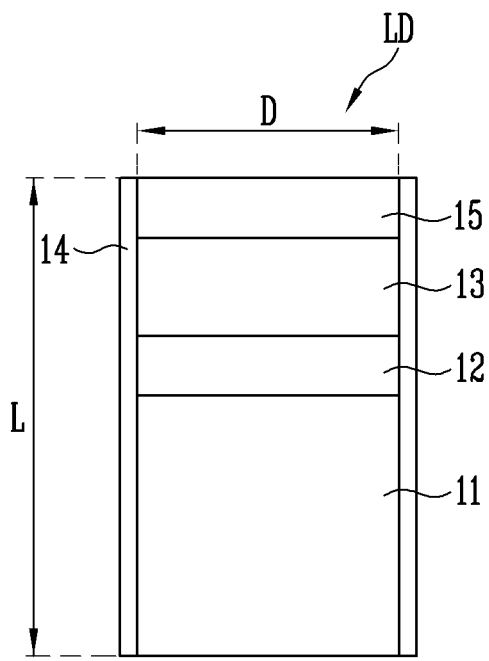
FIG. 2B illustrates a cross-sectional view of the light emitting device of FIG. 2A.
Figure 3A:
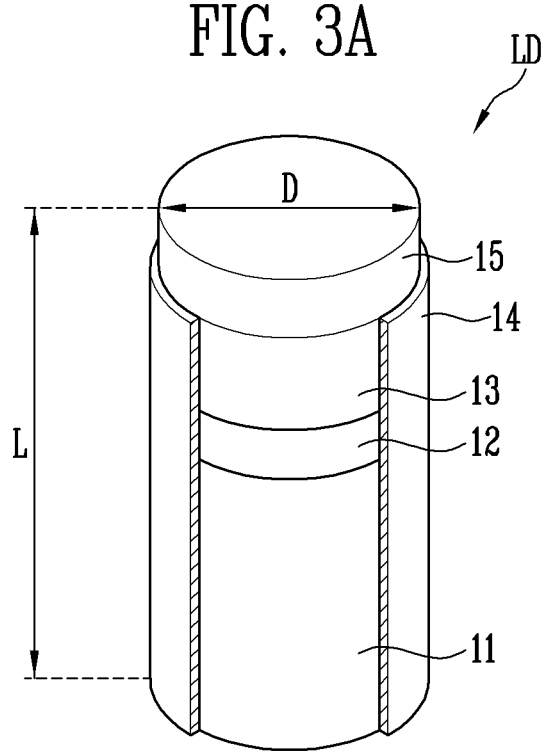
FIG. 3A schematically illustrates a perspective cutaway view of a light emitting element according to another example embodiment of the present disclosure.
Figure 3B:
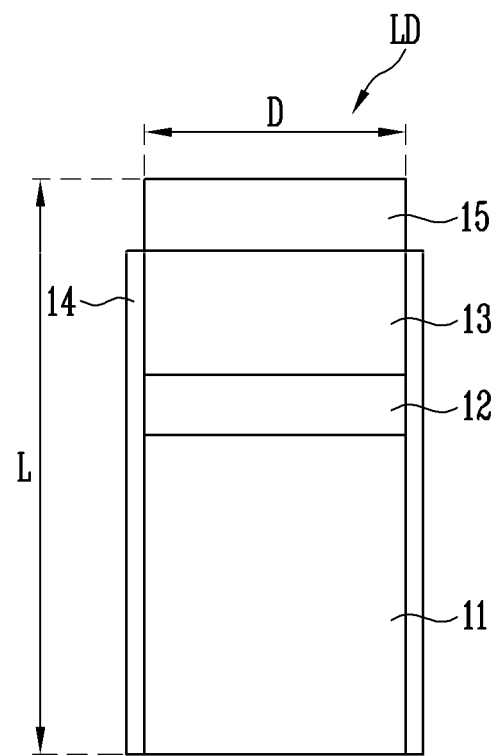
FIG. 3B illustrates a cross-sectional view of the light emitting device of FIG. 3A.
Figure 4A:
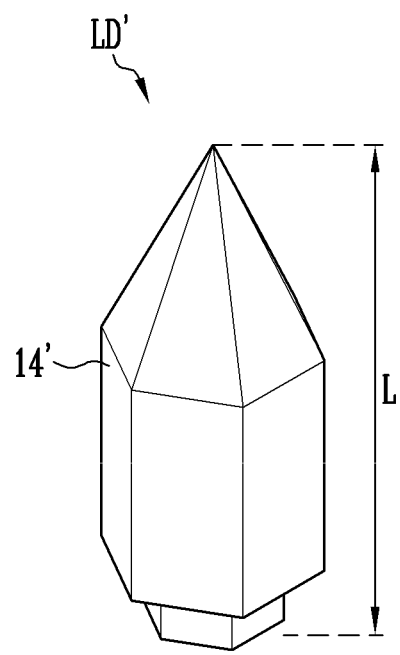
FIG. 4A schematically illustrates a perspective view of a light emitting element according to another example embodiment of the present disclosure.
Figure 4B:
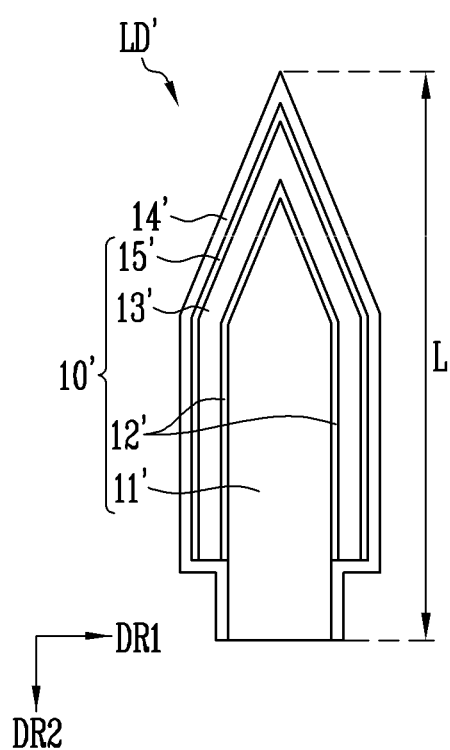
FIG. 4B illustrates a cross-sectional view of the light emitting device of FIG. 4A.

FIG. 1A schematically illustrates a perspective cutaway view of a light emitting element according to one or more example embodiments of the present disclosure, FIG. 1B illustrates a cross-sectional view of the light emitting device of FIG. 1A, FIG. 2A schematically illustrates a perspective cutaway view of a light emitting element according to another example embodiment of the present disclosure, FIG. 2B illustrates a cross-sectional view of the light emitting device of FIG. 2A, FIG. 3A schematically illustrates a perspective cutaway view of a light emitting element according to another example embodiment of the present disclosure, FIG. 3B illustrates a cross-sectional view of the light emitting device of FIG. 3A, FIG. 4A schematically illustrates a perspective view of a light emitting element according to another example embodiment of the present disclosure, and FIG. 4B illustrates a cross-sectional view of the light emitting device of FIG. 4A.

For convenience, after describing FIGS. 1A, 1B, 2A, 2B, 3A, and 3B illustrating the light emitting elements manufactured by an etch method, FIGS. 4A and 4B illustrating a light emitting element manufactured by a growth method will be described. In one or more example embodiments of the present disclosure, a type and/or shape of the light emitting element is not limited to the embodiments illustrated in FIGS. 1A, 1B, 2A, 2B, 3A, 3B, 4A, and 4B.

First, referring to FIGS. 1A, 1B, 2A, 2B, 3A, and 3B, a light emitting element LD includes a first semiconductor layer 11, a second semiconductor layer 13, and an active layer 12 interposed between the first and second semiconductor layers 11 and 13. For example, the light emitting element LD may be implemented as a stacked light emitting body in which the first semiconductor layer 11, the active layer 12, and the second semiconductor layer 13 are sequentially stacked.

The light emitting element LD may be provided to have a shape extending in one direction. When the extending direction of the light emitting element LD is a length direction, the light emitting element LD may include one end portion (or lower end portion) and the other end portion (or upper end portion) along the extending direction. One of the first and second semiconductor layers 11 and 13 may be disposed at one end portion (or lower end portion) of the light emitting element LD, and the remaining one of the semiconductor layers of the first and second semiconductor layers 11 and 13 may be disposed at the other end portion (or upper end portion) of the light emitting element LD. For example, the first semiconductor layer 11 may be disposed at one end portion (or lower end portion) of the light emitting element LD, and the second semiconductor layer 13 may be disposed at the other end portion (or upper end portion) of the light emitting element LD.

The light emitting element LD may be provided in various shapes. For example, the light emitting element LD may have a rod-like shape or a bar-like shape that is long in the length direction (that is, an aspect ratio is greater than 1). In one or more example embodiments of the present disclosure, a length L of the light emitting element LD in the length direction may be larger than a diameter D thereof (or a width of a cross-section thereof). For example, the light emitting element LD may include a light emitting diode (LED) made in a ultra-small size having a nano scale to a micro scale of diameter D and/or length L.

The diameter D of the light emitting element LD may be about 0.5 μm to 500 μm, and the length L thereof may be about 1 μm to 10 μm. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD is applied.

For example, the first semiconductor layer 11 may include at least one n-type semiconductor layer. For example, the first semiconductor layer 11 may include a semiconductor material of one or more of InAlGaN, GaN, AlGaN, InGaN, AlN, and InN, and may be a n-type semiconductor layer doped with a first conductive dopant (or n-type dopant) such as Si, Ge, Sn, or the like. However, the material included in the first semiconductor layer 11 is not limited thereto, and the first semiconductor layer 11 may be made of various suitable materials. In one or more example embodiments of the present disclosure, the first semiconductor layer 11 may include a gallium nitride (GaN) semiconductor material doped with the first conductive dopant (or n-type dopant). For example, the first semiconductor layer 11 may be an n-type GaN semiconductor layer. The first semiconductor layer 11 may include an upper surface contacting the active layer 12 along the direction of the length L of the light emitting element LD and a lower surface exposed to the outside. The lower surface of the first semiconductor layer 11 may be one end portion (or lower end portion) of the light emitting element LD.

The active layer 12 is disposed on the first semiconductor layer 11, and may be formed to have a single or multiple quantum well structure. For example, when the active layer 12 is formed of a multi-quantum well structure, the active layer 12 may have a structure in which a barrier layer (not shown), a strain reinforcing layer, and a well layer, which consist of one unit, are periodically and repeatedly stacked. Because the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength of 400 nm to 900 nm, and may have a double hetero structure. In one or more example embodiments of the present disclosure, a cladding layer (not shown) doped with a conductive dopant may be formed on upper and/or lower portions of the active layer 12 along the direction of the length L of the light emitting element LD. For example, the clad layer may be formed as an AlGaN layer or an InAlGaN layer. In some embodiments, a material such as AlGaN or InAlGaN may be used to form the active layer 12, and in addition, various materials may form the active layer 12. The active layer 12 may include a first surface contacting the first semiconductor layer 11 and a second surface contacting the second semiconductor layer 13. The first surface and the second surface of the active layer 12 may face each other in the direction of the length L of the light emitting element LD.

When an electric field of a suitable voltage (e.g., a set voltage or a predetermined voltage) or more is applied between end portions of the light emitting element LD, the light emitting element LD emits light while electron-hole pairs are combined in the active layer 12. By controlling the light emission of the light emitting element LD by using this principle, the light emitting element LD may be used as a light source (or light emitting source) for various light emitting devices in addition to pixels of a display device.

The second semiconductor layer 13 is disposed on the second surface of the active layer 12, and may include a semiconductor layer of a type different from that of the first semiconductor layer 11. For example, the second semiconductor layer 13 may be formed of a semiconductor material different from the semiconductor material of the first semiconductor layer 11, or the second semiconductor layer 13 may be formed of a semiconductor material having material properties that are different from material properties of the semiconductor material of the first semiconductor layer 11.

For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg. However, the material included in the second semiconductor layer 13 is not limited thereto, and the second semiconductor layer 13 may be formed of various materials. In one or more example embodiments of the present disclosure, the second semiconductor layer 13 may include a gallium nitride (GaN) semiconductor material doped with the second conductive dopant (or p-type dopant). For example, the second semiconductor layer 13 may be a p-type GaN semiconductor. As shown in FIG. 1A and FIG. 1B, the second semiconductor layer 13 may include a lower surface contacting the second surface of the active layer 12 along the direction of the length L of the light emitting element LD and an upper surface exposed to the outside. Here, the upper surface of the second semiconductor layer 13 may be the other end portion (or upper end portion) of the light emitting element LD.

In one or more example embodiments of the present disclosure, the first semiconductor layer 11 and the second semiconductor layer 13 may have different thicknesses from each other in the direction of the length L of the light emitting element LD. For example, the first semiconductor layer 11 may have a relatively thicker thickness than that of the second semiconductor layer 13 along the direction of the length L of the light emitting element LD. Accordingly, the active layer 12 of the light emitting element LD may be disposed closer to the upper surface of the second semiconductor layer 13 than the lower surface of the first semiconductor layer 11 as shown in FIG. 1A and FIG. 1B.

FIG. 1A and FIG. 1B illustrate that the first semiconductor layer 11 and the second semiconductor layer 13 are configured as one layer, but the present disclosure is not limited thereto. In one or more example embodiments of the present disclosure, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the present disclosure is not limited thereto.

In some embodiments, the light emitting element LD may further include an additional electrode 15 (hereinafter referred to as a 'first additional electrode') disposed on the second semiconductor layer 13 in addition to the first semiconductor layer 11, the active layer 12, and the second semiconductor layer 13 described above as shown in FIG. 2A-FIG. 3B. In another embodiment, another additional electrode (not shown, hereinafter referred to as a "second additional electrode") disposed on one end of the first semiconductor layer 11 may be further included.

The first additional electrode 15 and the second additional electrode may be ohmic contact electrodes, but are not limited thereto, and may be Schottky contact electrodes according to one or more example embodiments. The first additional electrode 15 and the second additional electrode may include a conductive material (or substance). For example, the first additional electrode 15 and the second additional electrode may include an opaque metal in which chromium (Cr), titanium (Ti), aluminum (Al), gold (Au), nickel (Ni), and an oxide or alloy thereof are used alone or in combination, but the present disclosure is not limited thereto. In some embodiments, the first additional electrode 15 and the second additional electrode may include a transparent conductive oxide such as an indium tin oxide (ITO), an indium zinc oxide (IZO), an zinc oxide (ZnO), or an indium tin zinc (ITZO).

Materials included in the first additional electrode 15 and the second additional electrode may be the same or different from each other. The first additional electrode 15 and the second additional electrode may be substantially transparent or transflective. Accordingly, light generated by the light emitting element LD may transmit through the first additional electrode 15 and the second additional electrode to be output to the outside of the light emitting element LD. In some embodiments, when the light generated by the light emitting element LD does not transmit through the first additional electrode 15 and the second additional electrode and is discharged to the outside through a region except for respective ends of the light emitting element LD, the first additional electrode 15 and the second additional electrode may include an opaque metal.

In one or more example embodiments of the present disclosure, the light emitting element LD may further include an insulating film 14. However, in some embodiments, the insulating film 14 may be omitted, or it may be provided so as to cover only some of the first semiconductor layer 11, the active layer 12, and the second semiconductor layer 13.

The insulating film 14 may prevent (or protect from) an electrical short circuit that may occur when the active layer 12 contacts conductive materials other than the first semiconductor layer 11 and the second semiconductor layer 13. By forming the insulating film 14, a surface defect of the light emitting element LD may be minimized or reduced, thereby improving lifetime and efficiency. When a plurality of light emitting elements LD are closely disposed, the insulating film 14 may prevent (or protect from) unwanted short circuits that may occur between the light emitting elements LD. If the active layer 12 may prevent (or protect from) a short circuit with an external conductive material from being caused, whether or not the insulating film 14 is provided is not limited.

As shown in FIG. 1A and FIG. 1B, the insulating film 14 may be provided in a form partially or entirely surrounding an outer surface (e.g., an outer peripheral surface or an outer circumferential surface) of a light emitting laminate including the first semiconductor layer 11, the active layer 12, and the second semiconductor layer 13. For convenience of description, FIG. 1A illustrates a state in which a portion of the insulating film 14 is removed, but the first semiconductor layer 11, the active layer 12, and the second semiconductor layer 13 included in an actual light emitting element LD may be surrounded by (or partially surrounded by) the insulating film 14.

In the above-described embodiment, the structure in which the insulating film 14 wholly surrounds the outer surfaces (e.g., an outer peripheral surface or outer circumferential surfaces) of the first semiconductor layer 11, the active layer 12, and the second semiconductor layer 13 is described, but the present disclosure is not limited thereto. In some embodiments, when the light emitting element LD includes the additional electrode 15, as shown in FIG. 2A and FIG. 2B, the insulating film 14 may entirely surround the outer surface (e.g., an outer peripheral surface or outer circumferential surface) of each of the first semiconductor layer 11, the active layer 12, the second semiconductor layer 13, and the additional electrode 15. According to another embodiment, as shown FIG. 3A and FIG. 3B, the insulating film 14 does not entirely surround the outer surface (e.g., an outer peripheral surface or outer circumferential surface) of the additional electrode 15 disposed on the second semiconductor layer 13, or may surround only a portion of the outer surface (e.g., an outer peripheral surface or outer circumferential surface) of the additional electrode 15 and may not surround the remaining portion of the outer surface (e.g., an outer peripheral surface or outer circumferential surface) of the additional electrode 15. However, the insulating film 14 exposes at least both end portions of the light emitting element LD, and for example, it may expose one end portion of the first semiconductor layer 11 in addition to the additional electrode 15 disposed on one side of the second semiconductor layer 13

In some embodiments, when the first additional electrode 15 is disposed at the other end portion (or upper end portion) of the light emitting element LD and the second additional electrode is disposed at one end portion (or lower end portion) of the light emitting element LD, the insulating film 14 may expose at least one region of the first additional electrode 15 and at least one region of the second additional electrode. In another embodiment, the insulating film 14 may not be provided.

According to one or more example embodiments of the present disclosure, the insulating film 14 may include a transparent insulating material. For example, the insulating film 14 may include one or more insulating material of a silicon oxide (SiOx), a silicon nitride (SiNx), a silicon oxynitride (SiONx), an aluminum oxide (AlOx), and a titanium dioxide (TiO$_2$), but is not limited thereto, and various materials having insulating properties may be used therefor.

When the insulating film 14 is provided in the light emitting element LD, it is possible to prevent the active layer 12 from being shorted to driving electrodes (not shown). By forming the insulating film 14, surface defects of the light emitting element LD may be minimized or reduced to improve a lifespan and light emission efficiency of the light emitting element LD. When a plurality of light emitting elements LD are closely disposed, the insulating film 14 may prevent (or protect from) unwanted short circuits that may occur of between the light emitting elements LD.

The light emitting element LD described above may be used as a light emitting source of various display devices. The light emitting element LD may be manufactured through a surface treatment process. For example, when a plurality of light emitting elements LD are mixed with a fluid solution (or a solvent) and supplied to each pixel area (for example, a light emitting area of each pixel or a light emitting area of each sub pixel), each light emitting element LD may be surface-treated so that the light emitting elements LD are not non-uniformly aggregated in the solution and are uniformly sprayed.

A light emitting unit (or light emitting device) including the above-described light emitting element LD may be used in various types of electronic devices that require a light source in addition to the display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Hereinafter, a light emitting element LD' manufactured by a growth method will be described with reference to FIG. 4A and FIG. 4B.

When the light emitting element LD' manufactured by the growth method is described, differences from the above-described embodiment will be mainly described, and features not specifically described in the light emitting element LD' manufactured by the growth method follow the those of the example embodiments described above.

Referring to FIG. 4A and FIG. 4B, a light emitting element LD' according to an example embodiment of the present disclosure may include a first semiconductor layer 11', a second semiconductor layer 13', and an active layer 12' interposed between the first semiconductor layer 11' and the second semiconductor layer 13'. In some embodiments, the light emitting element LD' may include a light emitting pattern 10' having a core-shell structure including a first semiconductor layer 11' disposed in a center (or middle) of the light emitting element LD', an active layer 12' surrounding at least one side of the first semiconductor layer 11' (e.g., the active layer 12' may surround the first semiconductor layer 11' around the periphery of the first semiconductor layer 11'), a second semiconductor layer 13' surrounding at least one side of the active layer 12' (e.g., the second semiconductor layer 13' may surround the active layer 12' around the periphery of the active layer 12'), and an additional electrode 15' surrounding at least one side of the second semiconductor layer 13' (e.g., the added electrode 15' may surround the second semiconductor layer 13' around the periphery of the second semiconductor layer 13').

The light emitting element LD' may be provided to have a polygonal horn shape extending in one direction. For example, the light emitting element LD' may be provide to have a hexagonal horn shape. When the extending direction of the light emitting element LD' is a length direction, the light emitting element LD' may have one end portion (or lower end portion) and the other end portion (or upper end portion) along the length direction. A portion of one of the first and second semiconductor layers 11' and 13' may be exposed at one end portion (or lower end portion) of the light emitting element LD', and a portion of the other one of the first and second semiconductor layers 11' and 13' may be exposed at the other end portion (or upper end portion) of the light emitting element LD'. For example, a portion of the first semiconductor layer 11' may be exposed at one end portion (or lower end portion) of the light emitting element LD', and a portion of the second semiconductor layer 13' may be exposed at the other end portion (or upper end portion) of the light emitting element LD'. In this case, when the light emitting element LD' is applied as a light source of the display device, the exposed portion of the first semiconductor layer 11' may contact one of driving electrodes for driving the light emitting element LD', and the exposed portion of the semiconductor layer 13' may contact another driving electrode.

In some embodiments, when the light emitting element LD' includes the additional electrode 15', a portion of the additional electrode 15' surrounding at least one side of the second semiconductor layer 13' at the other end portion (or upper end portion) of the light emitting element LD' may be exposed. In this case, when the light emitting element LD' is applied as a light source of the display device, the exposed portion of the additional electrode 15' may contact the other driving electrode to be electrically connected to one electrode.

In one or more example embodiments of the present disclosure, the first semiconductor layer 11' may be disposed at a core of the light emitting element LD, that is, at a center (or middle) thereof. The light emitting element LD' may be provided to have a shape corresponding to a shape of the first semiconductor layer 11'. For example, when the first semiconductor layer 11' has a hexagonal horn shape, the light emitting element LD' and the light emitting pattern 10' may have a hexagonal horn shape.

The active layer 12' may be provided and/or formed to surround (or partially cover) the outer surface (e.g., the outer peripheral surface or the outer circumferential surface) of the first semiconductor layer 11' in the direction of the length L of the light emitting element LD'. For example, the active layer 12' may be provided and/or formed to surround a remaining area excluding the other end portion disposed at a lower side of both end portions of the first semiconductor layer 11' in the direction of the length L of the light emitting element LD'.

The second semiconductor layer 13' is provided and/or formed to surround the active layer 12' in the length (L) direction of the light emitting element LD', and may include a semiconductor layer of a different type from that of the first semiconductor layer 11'. For example, when the first semiconductor layer 11' includes an n-type semiconductor layer, the second semiconductor layer 13' may include a p-type semiconductor layer. For example, the second semiconductor layer 13' may be formed of a semiconductor material different from the semiconductor material of the first semiconductor layer 11', or the second semiconductor layer 13' may be formed of a semiconductor material having material properties that are different from material properties of the semiconductor material of the first semiconductor layer 11'.

In one or more example embodiments of the present disclosure, the light emitting element LD' may include an additional electrode 15' surrounding at least one side of the second semiconductor layer 13'. The additional electrode 15' may be an ohmic contact electrode or a Schottky contact electrode, which is electrically connected to the second semiconductor layer 13', but is not limited thereto.

As described above, the light emitting element LD' may be configured to have a hexagonal horn shape having both end portions that protrude, and it may be implemented with the light-emitting pattern 10' of a core-shell structure including the first semiconductor layer 11' provided at a center thereof, the active layer 12' surrounding the first semiconductor layer 11', the second semiconductor layer 13' surrounding the active layer 12', and the additional electrode 15' surrounding the second semiconductor layer 13'. The first semiconductor layer 11' may be disposed at one end portion (or lower end portion) of the light emitting element LD' having a hexagonal horn shape, and the additional electrode 15' may be disposed at the other end portion (or upper end portion) of the light emitting element LD'.

In some embodiments, the light emitting element LD' may further include the insulating film 14' provided on an outer surface (e.g., an outer peripheral surface or the outer circumferential surface) of the light emitting pattern 10' having a core-shell structure. The insulating film 14' may include a transparent insulating material.

Figure 5:
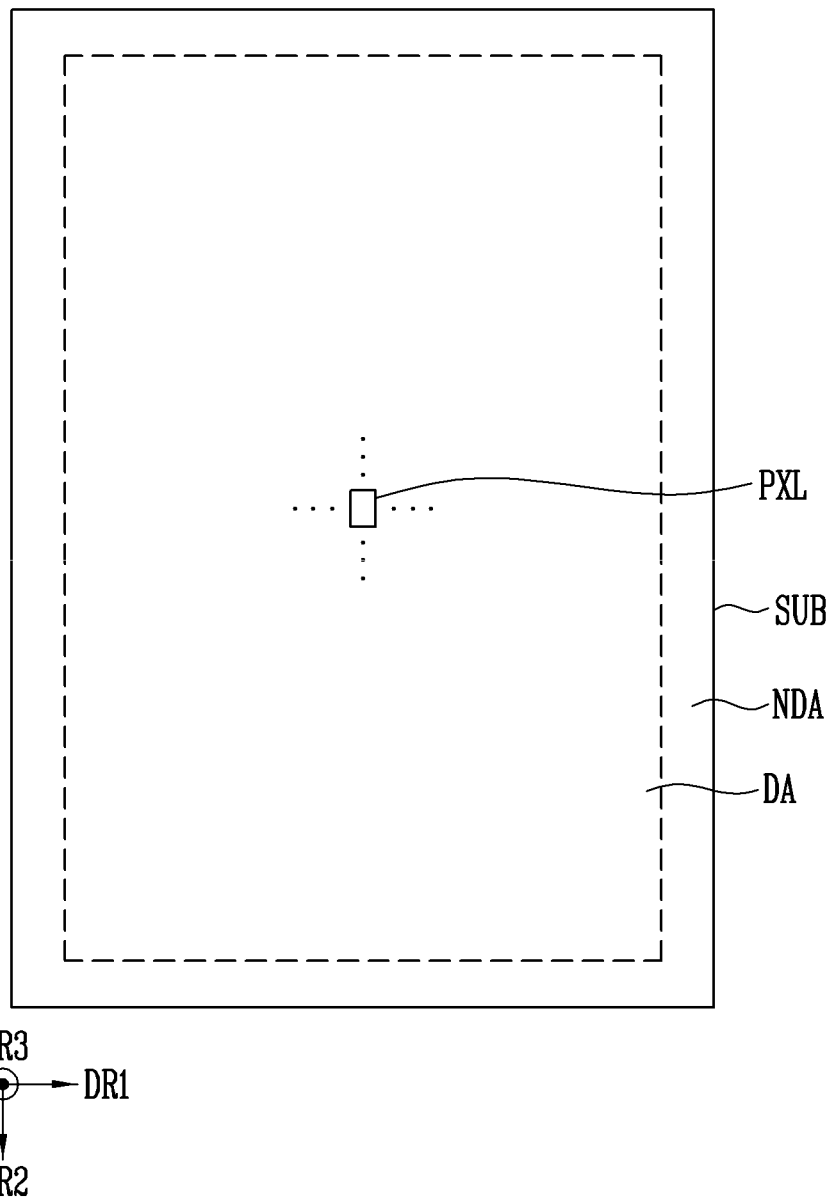
FIG. 5 illustrates a display device according to one or more example embodiments of the present disclosure, and for example, it illustrates a schematic top plan view of the display device using one of the light emitting elements shown in FIGS. 1A, 1B, 2A, 2B, 3A, 3B, 4A, and 4B as a light emitting source.

FIG. 5 illustrates a display device according to an example embodiment of the present disclosure, and for example, it illustrates a schematic top plan view of the display device using one of the light emitting elements shown in FIGS. 1A, 1B, 2A, 2B, 3A, 3B, 4A, and 4B as a light emitting source.

In FIG. 5, for convenience, a structure of the display device is briefly illustrated based on a display area DA on which an image is displayed. However, in some embodiments, at least one driver not shown (for example, a scan driver, a data driver, and the like) and/or a plurality of signal wires not shown may be further disposed on the display device.

Referring to FIGS. 1A, 1B, 2A, 2B, 3A, 3B, 4A, 4B, and 5, the display device according to one or more example embodiments of the present disclosure may include a substrate SUB, a plurality of pixels PXL provided on the substrate SUB and each including at least one light emitting element LD, a driving part provided on the substrate SUB and driving the pixels PXL, and a wire part connecting the pixels PXL and the driving part.

When the display device is an electronic device having a display surface applied to at least one surface thereof, such as a smart phone, television, tablet PC, mobile phone, video phone, e-book reader, desktop PC, laptop PC, netbook computer, workstation, server, PDA, portable multimedia player (PMP), MP3 player, medical device, camera, or wearable device, the present disclosure may be applied.

The display device may be classified into a passive matrix type display device and an active matrix type display device according to a method of driving the light emitting element LD. For example, when the display device is implemented as the active matrix type display device, each of the pixels PXL may include a driving transistor for controlling an amount of current supplied to the light emitting element LD, a switching transistor for transmitting a data signal to the driving transistor, and the like.

Recently, the active matrix type display device that selectively turns on each pixel PXL in terms of resolution, contrast, and operation speed has become mainstream, but the present disclosure is not limited thereto, and the passive matrix display device in which light emitting for each pixel group is performed may also use constituent elements (for example, first and second electrodes) for driving the light emitting element LD.

The substrate SUB may include a display area DA and a non-display area NDA.

In some embodiments, the display area DA may be disposed in a central area of the display device, and the non-display area NDA may be disposed in an edge area (or a peripheral area) of the display device so as to surround the display area DA. For example, the non-display area NDA may be located adjacent to the display area DA along one or more edges (or around a periphery) of the display area DA. However, the positions of the display area DA and the non-display area NDA are not limited thereto, and their positions may be changed.

The display area DA may be an area in which the pixels PXL for displaying an image are provided. The non-display area NDA may be an area in which the driving part for driving the pixels PXL and a portion of the wire part for connecting the driving and the pixels PXL are provided. For convenience of description, only one pixel PXL is illustrated in FIG. 5, but a plurality of pixels PXL may be substantially disposed in the display area DA of the substrate SUB.

The display area DA may have various shapes. For example, the display area DA may be provided in a closed polygon including a side consisting of a straight line. In some embodiments, the display area DA may be provided in a circle shape and/or an ellipse shape including a side consisting of a curved line. In some other embodiments, the display area DA may be provided in various shapes such as a semicircle and a semi-ellipse including a side consisting of a straight and curved line.

The non-display area NDA may be provided in at least one side of the display area DA. In one or more example embodiments of the present disclosure, the non-display area NDA may surround the display area DA along a periphery (or a circumference or an edge) of the display area DA.

The non-display area NDA may be provided with a wire part connected to the pixels PXL and a driving part for driving the pixels PXL.

The wire part may electrically connect the driving part and the pixels PXL. The wire part provides a signal to each pixel PXL, and it may be signal lines connected to each pixel PXL, for example, a fan-out line connected to a scan line, a data line, a light emitting control line, and the like. The wire part is a fan-out line connected to signal lines connected to each pixel PXL, for example, connected to a control line, a sensing line, and the like, in order to compensate for changes in electrical characteristics of each pixel PXL in real time.

The substrate SUB may include a transparent insulating material to transmit light. The substrate SUB may be a rigid substrate or a flexible substrate.

One area on the substrate SUB is provided as the display area DA in which pixels PXL are disposed, and the remaining area on the substrate SUB may be provided as the non-display area NDA. For example, the substrate SUB may include the display area DA including pixel areas in which each pixels PXL is disposed, and the non-display area NDA disposed around the display area DA.

Each of the pixels PXL may be provided in the display area DA on the substrate SUB. In one or more example embodiments of the present disclosure, the pixels PXL may be arranged in the display area DA in a stripe (e.g., matrix) or pentile arrangement structure, but the present disclosure is not limited thereto.

Each pixel PXL may include at least one or more light emitting element LD driven by a corresponding scan signal and data signal. The light emitting element LD has a size as small as a nano scale to a micro-scale, and may be mutually connected to light emitting elements disposed adjacent, in parallel, but the present disclosure is not limited thereto. The light emitting element LD may form a light source of each pixel PXL.

Each pixel PXL includes at least one light source driven by a suitable signal (e.g., a set signal or a predetermined signal, for example, a scan signal and a data signal) and/or a suitable power source (e.g., a set power source or a predetermined power source, for example, a first driving power source and a second driving power source). For example, each pixel PXL may include the light emitting element LD shown in FIG. 1A-FIG. 4B, for example, at least one ultra-small light emitting element LD having a size as small as a nano-scale to a micro-scale. However, in one or more example embodiments of the present disclosure, the type of the light emitting element LD that may be used as the light source of each pixel PXL is not limited thereto.

In one or more example embodiments of the present disclosure, a color, a type, and/or a number of pixels PXL are not particularly limited, and for example, the color of light emitted from each pixel PXL may be variously changed.

The driving part may provide a suitable signal (e.g., a set signal or a predetermined signal) and a suitable power source (e.g., a set power or a predetermined power) to each pixel PXL through the wire part, thereby controlling driving of the pixel PXL.

The driver may include a scan driver for providing a scan signal to the pixels PXL through a scan line, a light emitting driver for providing a light emitting control signal to the pixels PXL through a light emitting control line, and a data driver for providing a data signal to the pixels PXL through a data line, and a timing controller. The timing controller may control the scan driver, the light emitting driver, and the data driver.

Figure 6A:
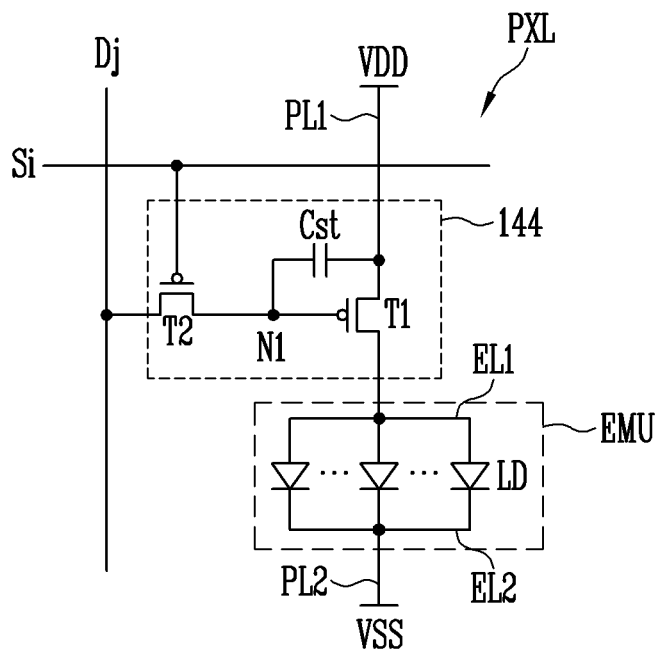
FIGS. 6A and 6B illustrate circuit diagrams of electrical connection relationships of constituent elements included in one pixel illustrated in FIG. 5 according to various example embodiments.
Figure 6B:
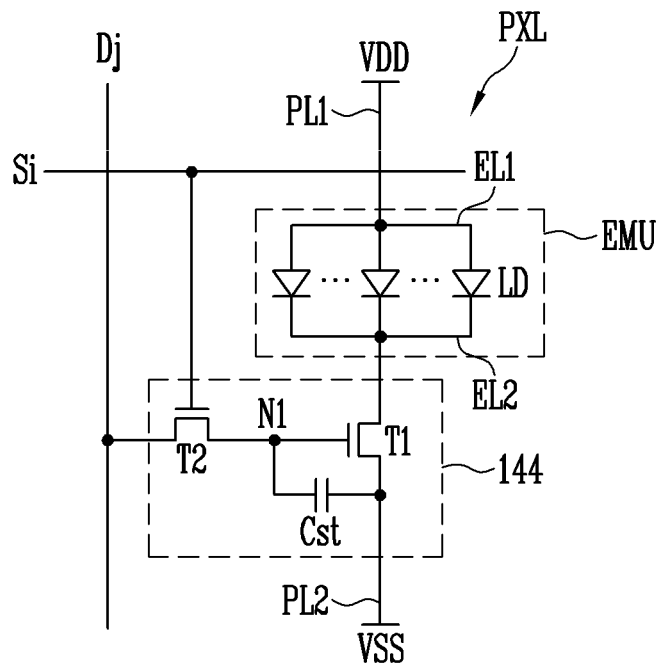

FIGS. 6A and 6B illustrate circuit diagrams of electrical connection relationships of constituent elements included in one pixel illustrated in FIG. 5 according to various embodiments.

For example, FIG. 6A and FIG. 6B illustrate electrical connection relationships of constituent elements included in a pixel PXL that may be applied to an active display device according to different embodiments. However, the types of constituent elements included in the pixel PXL to which the embodiment of the present disclosure may be applied are not limited thereto.

In FIG. 6A and FIG. 6B, not only the constituent elements included in each of the pixels illustrated in FIG. 5 but also the area in which the constituent elements are provided are referred to as the pixel PXL. In some embodiments, each pixel PXL illustrated in FIG. 6A and FIG. 6B may be one of the pixels PXL provided in the display device of FIG. 5, and the pixels PXL may have substantially the same or similar structure.

Referring to FIG. 1A-FIG. 4B, FIG. 5, FIG. 6A, and FIG. 6B, one pixel PXL (hereinafter referred to as 'pixel') may include a light emitting unit EMU that generates light having a luminance corresponding to a data signal. In some embodiments, the pixel PXL may selectively further include a pixel circuit 144 for driving the light emitting unit EMU.

According to one or more example embodiments, the light emitting unit EMU may include a plurality of light emitting elements LD connected in parallel between a first power line PL1 to which a voltage of a first driving power source VDD is applied and a second power line PL2 to which a voltage of a second driving power source VSS is applied. For example, the light emitting unit EMU may include a first electrode EL1 (or "first alignment electrode") connected to the first driving power source VDD through the pixel circuit 144 and the first power line PL1, a second electrode EL2 (or "second alignment electrode") connected to the second driving power source VSS through the second power line PL2, a plurality of light emitting elements LD connected in parallel in the same direction to each other between the first and second electrodes EL1 and EL2. In one or more example embodiments of the present disclosure, the first electrode EL1 may be an anode electrode, and the second electrode EL2 may be a cathode electrode.

In one or more example embodiments of the present disclosure, each of the light emitting elements LD included in the light emitting unit EMU may include one end portion connected to the first driving power source VDD through the first electrode EL1 and the other end portion connected to the second driving power source VSS through the second electrode EL2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, respective light emitting elements LD connected in parallel in the same direction (for example, a forward direction) between the first electrode EL1 and the second electrode EL2 respectively supplied with voltages of different potentials may form respective effective light source. These effective light sources may be collected to form the light emitting unit EMU of the pixel PXL.

The light emitting elements LD of the light emitting unit EMU may emit light with luminance corresponding to a driving current supplied through the corresponding pixel circuit 144. For example, during each frame period, the pixel circuit 144 may supply a driving current corresponding to a gray value of corresponding frame data to the light emitting unit EMU. The driving current supplied to the light emitting unit EMU may be divided to flow in the light emitting elements LD. Therefore, while each light emitting element LD emits light with a luminance corresponding to the current flowing therein, the light emitting unit EMU may emit light having a luminance corresponding to the driving current.

FIG. 6A and FIG. 6B illustrate an example embodiment in which respective end portions of the light emitting elements LD are connected in the same direction between the first and second driving power sources VDD and VSS, but the present disclosure is not limited thereto. In some embodiments, the light emitting unit EMU may further include at least one ineffective light source, for example, a reverse light emitting element (not shown), in addition to the light emitting elements LD forming respective effective light sources. The reverse light emitting element is connected in parallel between the first and second electrodes EL1 and EL2 together with the light emitting elements LD forming the effective light sources, but may be connected between the first and second electrodes EL1 and EL2 in the opposite direction with respect to the light emitting elements LD. The reverse light emitting element maintains an inactive state (e.g., a reverse biased state) even when a suitable driving voltage (e.g., a set driving voltage or a predetermined driving voltage, for example, a driving voltage in the forward direction) is applied between the first and second electrodes EL1 and EL2, thus a current does not substantially flow in the reverse light emitting element.

The pixel circuit 144 may be connected to a scan line Si and a data line Dj of the corresponding pixel PXL. For example, when the pixel PXL is disposed in an i-th row (i.e., i is a natural number) and a j-th column (i.e., j is a natural number) of the display area DA, the pixel circuit 144 of the pixel PXL may be connected to an i-th scan line Si and a j-th data line Dj of the display area DA. In some embodiments, the pixel circuit 144 may include first and second transistors T1 and T2 and a storage capacitor Cst. However, the structure of the pixel circuit 144 is not limited to those of the embodiments shown in FIG. 6A and FIG. 6B.

First, referring to FIG. 6A, the pixel circuit 144 may include the first and second transistors T1 and T2 and the storage capacitor Cst.

A first terminal of the second transistor T2 (e.g., a switching transistor) may be connected to the j-th data line Dj, and a second terminal thereof may be connected to a first node N1. Here, the first terminal and the second terminal of the second transistor T2 are different terminals, and for example, when the first terminal is a source electrode, the second terminal may be a drain electrode or vice versa. A gate electrode of the second transistor T2 may be connected to the i-th scan line Si.

The second transistor T2 is turned on when a scan signal of a voltage (for example, a low voltage) at which the second transistor T2 may be turned on is supplied from the i-th scan line Si to the gate electrode of the second transistor T2 to electrically connect the j-th data line Dj and the first node N1. In this case, a data signal of a corresponding frame is supplied to the j-th data line Dj, thus the data signal is transmitted to the first node N1. The data signal transmitted to the first node N1 is charged in the storage capacitor Cst.

A first terminal of the first transistor T1 (e.g., a driving transistor) may be connected to the first driving power source VDD, and a second terminal thereof may be electrically connected to the first electrode EL1 of each of the light emitting elements LD. A gate electrode of the first transistor T1 may be connected to the first node N1. The first transistor T1 controls an amount of driving current supplied to the light emitting elements LD in response to a voltage of the first node N1. For example, the first transistor T1 may control an amount of the driving current supplied to each of the light emitting elements LD of the light emitting unit EMU.

One electrode of the storage capacitor Cst may be connected to the first driving power source VDD, and the other electrode thereof may be connected to the first node N1. The storage capacitor Cst may be charged according to a voltage corresponding to the data signal supplied to the first node N1, and maintains the charged voltage until a data signal of a next frame is supplied.

FIG. 6A and FIG. 6B respectively illustrate the pixel circuit 144 including the second transistor T2 for transferring a data signal into the pixel PXL, the storage capacitor Cst for storing the data signal, and the first transistor T1 for supplying a driving current corresponding to the data signal to the light emitting elements LD.

However, the present disclosure is not limited thereto, and the structure of the pixel circuit 144 may be variously changed. For example, the pixel circuit 144 may additionally include at least one transistor element such as a transistor element for compensating a threshold voltage of the first transistor T1, a transistor element for initializing the first node N1, and/or a transistor element for controlling a light emitting time of the light emitting elements LD, or other circuit elements such as a boosting capacitor for boosting the voltage of the first node N1.

FIG. 6A illustrates the transistors included in the pixel circuit 144, for example, the first and second transistors T1 and T2 as P-type transistors, but the present disclosure is not limited thereto. For example, at least one of the first and second transistors T1 and T2 included in the pixel circuit 144 may be changed as an N-type transistor.

Next, referring to FIG. 1A-FIG. 4B, FIG. 5, and FIG. 6B, according to one or more example embodiments of the present disclosure, the first and second transistors T1 and T2 may be implemented as an N-type transistor. A structure or operation of the pixel circuit 144 shown in FIG. 6B is similar to the structure or operation of the pixel circuit 144 of FIG. 6A except for changes of connection positions of some constituent elements (e.g., the storage capacitor Cst is connected between the first node N1 and the second electrode of the first transistor T1) due to the change of the transistor type. Therefore, the structure or operation of the pixel circuit 144 shown in FIG. 6B will be briefly described.

In one or more example embodiments of the present disclosure, the pixel circuit 144 illustrated in FIG. 6B may include first and second transistors T1 and T2 that are N-type transistors and a storage capacitor Cst. When the first and second transistors T1 and T2 are the N-type transistors, the light emitting unit EMU may be connected between the first driving power source VDD and the pixel circuit 144 so as to stabilize the storage capacitor Cst charging a voltage corresponding to a data signal supplied to the first node N1. However, the present disclosure is not limited thereto, and in some embodiments, the light emitting unit EMU illustrated in FIG. 6B may be connected between the pixel circuit 144 and the second driving power source VSS. In one or more example embodiments of the present disclosure, the configuration of the pixel circuit 144 is not limited to the embodiments shown in FIG. 6A and FIG. 6B.

In some embodiments, the pixel circuit 144 may be connected to a control line, a sensing line, and the like to compensate for changes in electrical characteristics in real time. In this case, the pixel circuit 144 may include a sensing transistor that is turned on by a control signal supplied to the control line to electrically connect the sensing line and the first transistor T1. Therefore, characteristic information of each pixel PXL including the threshold voltage of the first transistor T1 may be extracted through the sensing line, and the extracted characteristic information may be used to convert image data to compensate for characteristic deviation between the pixels PXL.

FIG. 6A and FIG. 6B illustrate one or more example embodiments in which the light emitting elements LD forming each light emitting unit EMU are all connected in parallel, but the present disclosure is not limited thereto. In some embodiments, the light emitting unit EMU may be configured to include at least one series stage including a plurality of light emitting elements LD connected in parallel to each other. For example, the light emitting unit EMU may be configured to have a series/parallel mixed structure.

The structure of the pixel PXL that may be applied to the present disclosure is not limited to the embodiments illustrated in FIG. 6A and FIG. 6B, and the corresponding pixel PXL may have various structures. For example, each pixel PXL may be configured inside a passive light emitting display device or the like. In this case, the pixel circuit 144 may be omitted, and respective end portions of the light emitting elements LD included in the light emitting unit EMU may be directly connected to the i-th scan line Si, the j-th data line Dj, the first power line PL1 to which the first driving power source VDD is applied, the second power line PL2 to which the second driving power source VSS is applied, and/or a control line (e.g., a set control line or a predetermined control line).

Figure 7:
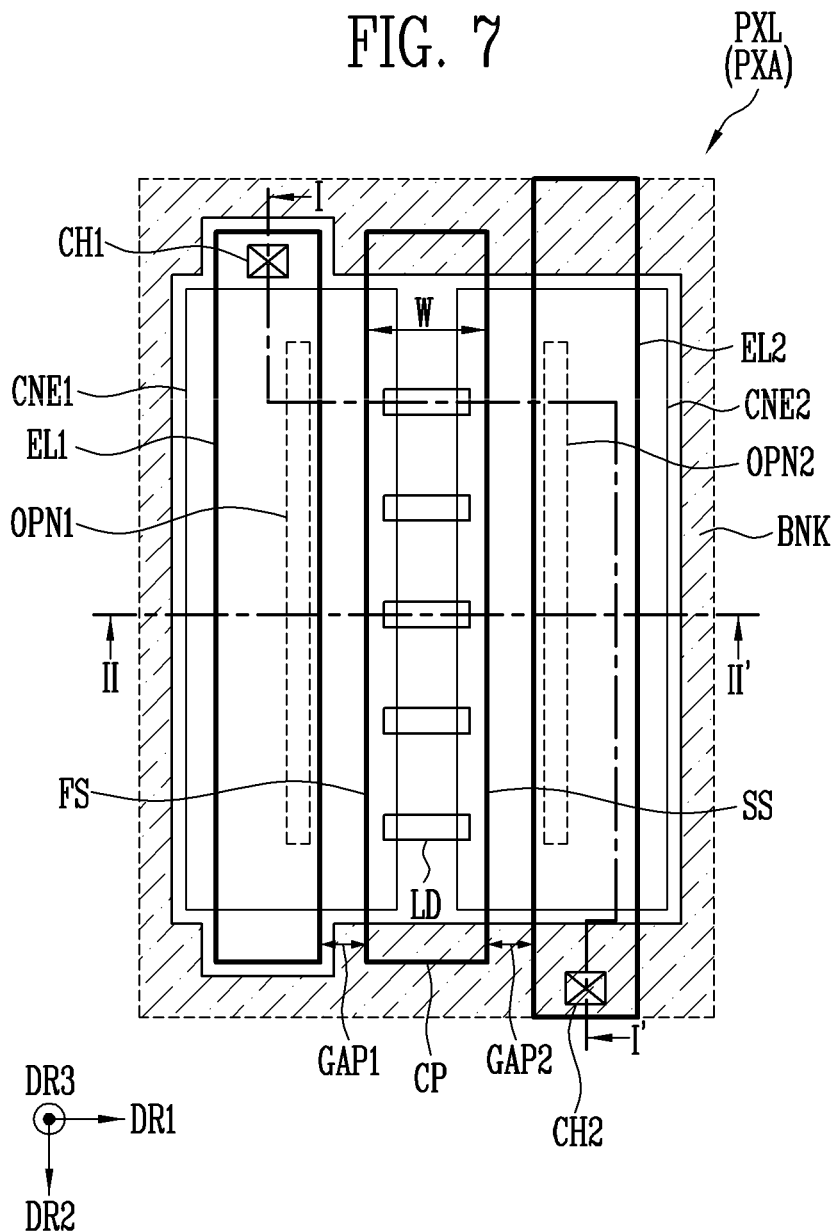
FIG. 7 schematically illustrates a top plan view of one of the pixels illustrated in FIG. 5.
Figure 8:
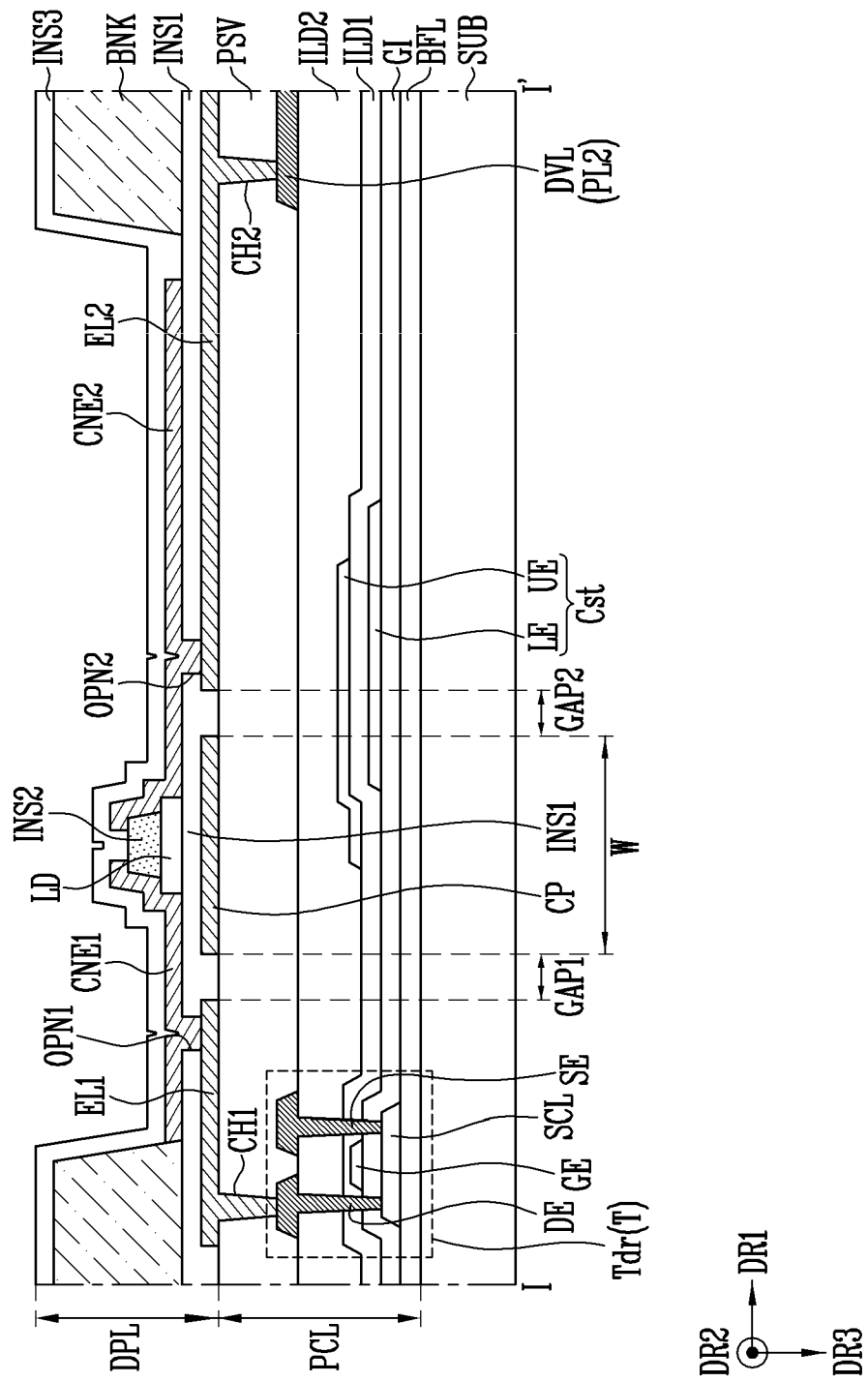
FIG. 8 illustrates a cross-sectional view taken along the line I-I' of FIG. 7.
Figure 9:
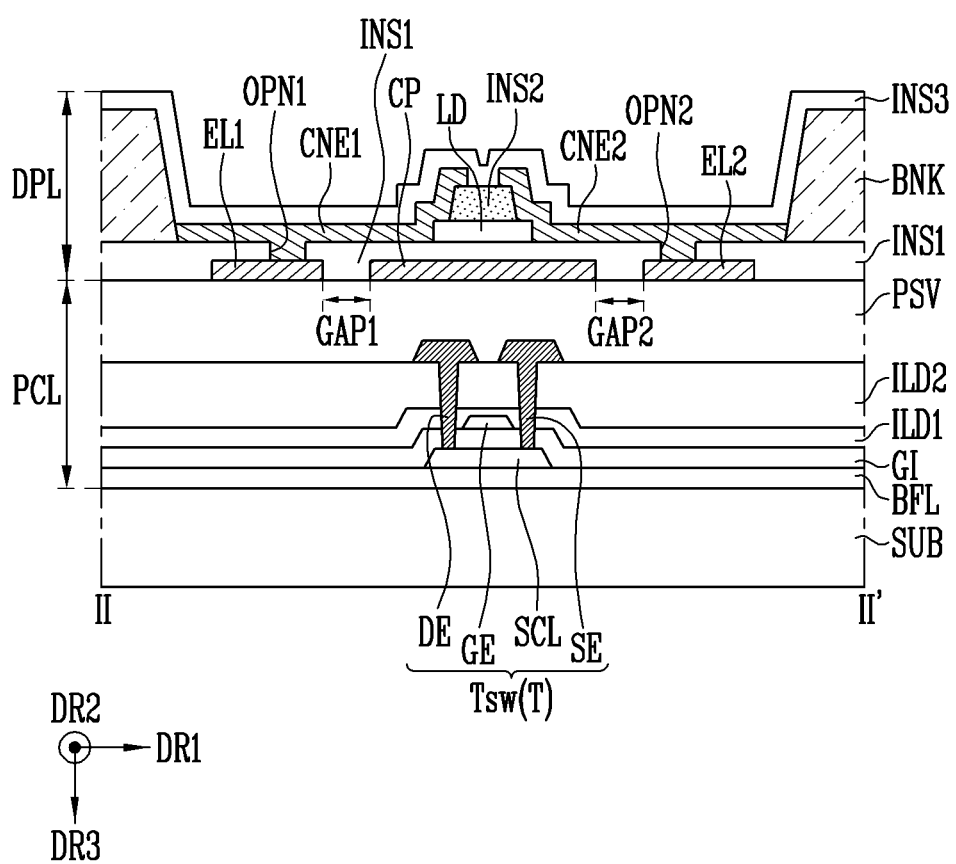
FIG. 9 illustrates a cross-sectional view taken along the line II-II' of FIG. 7.

FIG. 7 schematically illustrates a top plan view of one of the pixels illustrated in FIG. 5, FIG. 8 illustrates a cross-sectional view taken along the line I-I' of FIG. 7, and FIG. 9 illustrates a cross-sectional view taken along the line II-II' of FIG. 7.

The pixel illustrated in FIG. 7 may be the pixel illustrated in FIG. 6A.

In FIG. 7, for convenience, illustration of a transistor connected to the light emitting elements and some signal lines connected to the transistor is omitted.

In FIG. 7-FIG. 9, the structure of one pixel PXL is simplified by showing each electrode as an electrode of a single film and each insulating layer as an insulating layer of a single film, but the present disclosure is not limited thereto.

In one or more example embodiments of the present disclosure, "formed and/or provided on the same layer" means formed in the same process, and "formed and/or provided on another layer" means formed in a different process.

Furthermore, in one or more example embodiments of the present disclosure, "connection" between two elements may mean both electrical and physical connections.

In one or more example embodiments of the present disclosure, for convenience of description, a horizontal direction (or transverse direction) is indicated as a first direction DR1, a vertical direction (or longitudinal direction) is indicated as a second direction DR2, and a thickness direction of the substrate SUB is indicated as a third direction DR3. The first to third directions DR1, DR2, and DR3 may mean directions indicated by the first to third directions DR1, DR2, and DR3, respectively.

Referring to FIG. 1A-FIG. 5, FIG. 6A, and FIG. 7-FIG. 9, the display device according to one or more example embodiments of the present disclosure may include a plurality of pixels PXL provided on the substrate SUB.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which include a polymer organic material. For example, the flexible substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material included in the substrate SUB may be variously changed, and may also include fiber reinforced plastic (FRP). The material applied to the substrate SUB may have resistance (or heat resistance) to a high processing temperature in a manufacturing process of the display device.

The substrate SUB may include a display area DA including at least one pixel area PXA in which the pixel PXL is disposed, and a non-display area NDA disposed around the display area DA (see, for example, FIG. 5).

The pixels PXL may be arranged in a matrix form and/or a stripe form according to a plurality of pixel rows extending in the first direction DR1 in the display area DA on the substrate SUB and a plurality of pixel columns extending in the second direction DR2 different from the first direction DR1, for example, crossing the first direction DR1, but the present disclosure is not limited thereto. In some embodiments, the pixels PXL may be provided in the display area DA on the substrate SUB in various arrangements.

The pixel area PXA in which each pixel PXL is provided may include a light emitting area in which light is emitted and a peripheral area adjacent to the light emitting area (or surrounding an edge or a periphery of the light emitting area). In one or more example embodiments of the present disclosure, the peripheral area may include a non-emission area in which light is not emitted.

A wire part electrically connected to the pixels PXL may be disposed on the substrate SUB. The wire part may include a plurality of signal lines for transmitting a suitable signal (e.g., a set signal/voltage or a predetermined signal or a predetermined voltage) to each pixel PXL. The signal lines may include an i-th scan line Si for transmitting a scan signal to each pixel PXL, a j-th data line Dj for transmitting a data signal to each pixel PXL, and power lines PL1 and PL2 for transmitting a driving power source to each pixel PXL. In some embodiments, the wire part may further include a light emitting control line for transmitting an light emitting control signal to each pixel PXL. According to another embodiment, the wire part may further include a sensing line and a control line connected to each pixel PXL.

Each pixel PXL may be provided on the substrate SUB, and may include a pixel circuit layer PCL including the pixel circuit 144 and a display element layer DPL including the plurality of light emitting elements LD. The light emitting elements LD may be disposed in the pixel area PXA of each pixel PXL.

For convenience, the pixel circuit layer PCL is first described, and then the display element layer DPL is described.

The pixel circuit layer PCL may include a buffer layer BFL, a pixel circuit 144 provided on the buffer layer BFL, and a passivation layer PSV provided on the pixel circuit 144 (see FIG. 8).

The buffer layer BFL may prevent diffusion of impurities into the transistor T included in the pixel circuit 144 (e.g., the buffer layer BFL may protect the transistor T from diffusion of impurities from outside into the transistor T). The buffer layer BFL may be an inorganic insulating film including an inorganic material. The buffer layer BFL may include at least one of metal oxides such as a silicon nitride (SiNx), a silicon oxide (SiOx), a silicon oxynitride (SiONx), and an aluminum oxide (AlOx). The buffer layer BFL may be provided as a single film, but may be provided as a multi-film of at least two or more films. When the buffer layer BFL is provided as the multi-film, respective layers thereof may be made of the same material or different materials. The buffer layer BFL may be omitted depending on the material, a process condition, and the like of the substrate SUB.

The pixel circuit 144 may include at least one transistor T and a storage capacitor Cst. The transistor T may include a driving transistor Tdr (see FIG. 8) for controlling a driving current of the light emitting elements LD and a switching transistor Tsw (see FIG. 9) connected to the driving transistor Tdr. However, the present disclosure is not limited thereto, and the pixel circuit 144 may further include circuit elements that perform other functions in addition to the driving transistor Tdr and the switching transistor Tsw. In the following embodiment, the driving transistor Tdr and the switching transistor Tsw are collectively referred to as a transistor T or transistors T. The driving transistor Tdr may have the same configuration as the first transistor T1 described with reference to FIG. 6A, and the switching transistor Tsw may have the same configuration as the second transistor T2 described with reference to FIG. 6A.

Each of the driving transistor Tdr and the switching transistor Tsw may include a semiconductor pattern SCL, a gate electrode GE, a first terminal SE (e.g., a source electrode), and a second terminal DE (e.g., a drain electrode). The first terminal SE may be one of a source electrode and a drain electrode, and the second terminal DE may be the remaining one electrode from the source electrode and the drain electrode of the transistor T thereof. For example, when the first terminal SE is the source electrode, the second terminal DE may be the drain electrode.

The semiconductor pattern SCL may be provided and/or formed on the buffer layer BFL. The semiconductor pattern SCL may include a first contact region in contact with the first terminal SE and a second contact region in contact with the second terminal DE. A region between the first contact region and the second contact region may be a channel region. The channel region may overlap the gate electrode GE of the corresponding transistor T in the third direction DR3. The semiconductor pattern SCL may be a semiconductor pattern made of polysilicon, amorphous silicon, an oxide semiconductor, or the like. For example, the channel region, which is a semiconductor pattern that is not doped with impurities, may be an intrinsic semiconductor. The first contact region and the second contact region may be semiconductor patterns doped with impurities (e.g., n-type impurities or p-type impurities).

The gate electrode GE may be provided and/or formed on a gate insulating layer GI to correspond to the channel region of the semiconductor pattern SCL. The gate electrode GE may be provided on the gate insulating layer GI to overlap the channel region of the semiconductor pattern SCL of the corresponding transistor T in the third direction DR3. The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material.

The gate insulating layer GI may be an inorganic insulating film including an inorganic material. For example, the gate insulating layer GI may include at least one of metal oxides such as a silicon nitride (SiNx), a silicon oxide (SiOx), a silicon oxynitride (SiONx), and an aluminum oxide (AlOx). However, the material of the gate insulating layer GI is not limited to the above-described embodiments. In some embodiments, the gate insulating layer GI may be formed as an organic insulating film including an organic material. The gate insulating layer GI may be provided as a single film, and may be provided as a multi-film of at least two or more layers.

Each of the first terminal SE and the second terminal DE may be provided and/or formed on a second interlayer insulating layer ILD2, and may contact the first contact region and the second contact region of the semiconductor pattern SCL through a contact hole sequentially passing through the gate insulating layer GI and first and second interlayer insulating layers ILD1 and ILD2. For example, the first terminal SE may contact the first contact region of the semiconductor pattern SCL, and the second terminal DE may contact the second contact region of the semiconductor pattern SCL through respective contact holes passing through first and second interlayer insulation layers ILD1 and ILD2 and the gate insulation layer GI. Each of the first and second terminals SE and DE may include the same material as that of the gate electrode GE, or may include one or more materials selected from the materials illustrated as constituent materials of the gate electrode GE.

The first interlayer insulating layer ILD1 may include the same material as that of the gate insulating layer GI, or may include one or more materials selected from the materials illustrated as constituent materials of the gate insulating layer GI. The first interlayer insulating layer ILD1 may be disposed on the gate insulating layer GI.

The second interlayer insulating layer ILD2 may be provided and/or formed on the first interlayer insulating layer ILD1. The second interlayer insulating layer ILD2 may be an inorganic insulating film including an inorganic material or an organic insulating film including an organic material. In some embodiments, the second interlayer insulating layer ILD2 may include the same material as the first interlayer insulating layer ILD1, but the present disclosure is not limited thereto. The second interlayer insulating layer ILD2 may be provided as a single film, or may be provided as a multi-film of at least two or more layers.

In the above-described embodiment, although it is described that the first and second terminals SE and DE of each of the driving transistor Tdr and the switching transistor Tsw are separate electrodes electrically connected to the semiconductor pattern SCL through the respective contact holes sequentially passing through the gate insulating layers GI and the first and second interlayer insulating layers ILD1 and ILD2, the present disclosure is not limited thereto. In some embodiments, the first terminal SE of each of the driving transistor Tdr and the switching transistor Tsw may be a first contact region adjacent to the channel region of the corresponding semiconductor pattern SCL, and the second terminal DE of each of the driving transistor Tdr and the switching transistor Tsw may be a second contact region adjacent to the channel region of the semiconductor pattern SCL. In this case, for example, as shown in FIG. 8, the second terminal DE of the driving transistor Tdr may be electrically connected to the light emitting elements LD of the corresponding pixel PXL through a separate connection member, such as a bridge electrode (e.g., see FIG. 8).

In one or more example embodiments of the present disclosure, the transistors T included in the pixel circuit 144 may be low temperature polysilicon (LTPS) thin film transistors (TFT), but the present disclosure is not limited thereto, and in some embodiments, they may be oxide semiconductor thin film transistors or any suitable transistor known to those skilled in the art. Although the case in which the transistors T are thin film transistors having a top gate structure is described as an example, the present disclosure is not limited thereto, and the structure of the transistors T may be variously changed.

The storage capacitor Cst may include a lower electrode LE provided on the gate insulating layer GI and an upper electrode UE provided on the first interlayer insulating layer ILD1 and overlapping the lower electrode LE in the third direction DR3.

The lower electrode LE may be provided at the same layer as the gate electrode GE of each of the driving transistor Tdr and the switching transistor Tsw, and may include the same material. The lower electrode LE may be integrally provided or formed with the gate electrode GE of the driving transistor Tdr. In this case, the lower electrode LE may be regarded as a region of the gate electrode GE of the driving transistor Tdr. In some embodiments, the lower electrode LE may be provided in a separate configuration from the gate electrode GE of the driving transistor Tdr. In this case, the lower electrode LE and the gate electrode GE of the driving transistor Tdr may be electrically connected through a separate connection element.

The upper electrode UE may overlap the lower electrode LE in the third direction DR3, and may cover the lower electrode LE. Capacitance of the storage capacitor Cst may be increased by increasing an overlapping area of the upper electrode UE and the lower electrode LE. The upper electrode UE may be electrically connected to the first power line. The storage capacitor Cst may be covered by the second interlayer insulating layer ILD2.

The pixel circuit layer PCL may include a driving voltage wire DVL provided and/or formed on the second interlayer insulating layer ILD2 (see FIG. 8). The driving voltage wire DVL may have the same configuration as the second power line PL2 described with reference to FIG. 6A. The second driving power source VSS may be applied to the driving voltage wire and line DVL and PL2. The pixel circuit layer PCL may further include the first power line PL1 to which the first driving power source VDD is applied. The first power line PL1 may be provided at the same layer as the driving voltage wire DVL, or may be provided on a different layer from the driving voltage wires DVL and PL2. In one or more example embodiments of the present disclosure, it has been described that the driving voltage wires DVL and PL2 are provided at the same layer as the first and second terminals SE and DE of the driving transistor Tdr, but the present disclosure is limited thereto. In some embodiments, the driving voltage wires DVL and PL2 may be provided at the same layer as one of the conductive layers provided in the pixel circuit layer PCL. For example, the positions of the driving voltage wires DVL and PL2 in the pixel circuit layer PCL may be variously changed.

The first power line PL1 may be electrically connected to a portion of the display element layer DPL, for example, to the first electrode EL1, and the driving voltage wires DVL and PL2 may be electrically connected to a part of the display element layer DPL, for example, to the second electrode EL2. The first power line PL1 and the driving voltage wires DVL and PL2 may transmit an alignment signal (or alignment voltage) to the first and second electrodes EL1 and EL2 to align the light emitting elements LD in the pixel area PXA of each of the pixels PXL. In some embodiments, after the alignment of the light emitting elements LD, each of the first power line PL1 and the driving voltage wires DVL and PL2 transmits a corresponding driving power source to each pixel PXL to drive the light emitting elements LD.

Each of the first power line PL1 and the driving voltage wires DVL and PL2 may include a conductive material. For example, each of the first power line PL1 and the driving voltage wires DVL and PL2 may be formed to have a single film structure of a single material or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material. For example, each of the first power line PL1 and the driving voltage wires DVL and PL2 may be formed to have a double layer stacked in an order of titanium (Ti)/copper (Cu).

The passivation layer PSV may be provided and/or formed on the transistors T and the driving voltage wires DVL and PL2.

The passivation layer PSV may be include an organic insulating film, an inorganic insulating film, or the organic insulating layer disposed on the inorganic insulating film. The inorganic insulating film may include, for example, at least one of metal oxides such as a silicon nitride (SiNx), a silicon oxide (SiOx), a silicon oxynitride (SiONx), and an aluminum oxide (AlOx). The organic insulating film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, and benzocyclobutene resin.

The passivation layer PSV may include a first contact hole CH1 exposing the second terminal DE of the driving transistor Tdr and a second contact hole CH2 exposing a region of the driving voltage wires DVL and PL2 (see FIG. 8).

The display element layer DPL may be provided on the passivation layer PSV.

The display element layer DPL may include a bank BNK, the first and second electrodes EL1 and EL2, an intermediate pattern CP, the light emitting elements LD, and first and second contact electrodes CNE1 and CNE2. In some embodiments, the display element layer DPL may include first to third insulating layers INS1 to INS3.

The bank BNK may be disposed in a peripheral area surrounding at least one side of an emission area of a corresponding pixel PXL. The peripheral area may include a non-emission area in which light is not emitted.

The bank BNK may have a structure that defines (or partitions) each pixel area (PXA, or light emitting area) of each pixel PXL and adjacent pixels PXL, and for example, it may be a pixel-defining film. The bank BNK may be configured to include at least one light blocking material and/or a reflective material to prevent (or reduce) light leakage from occurring between each pixel PXL and pixels PXL adjacent thereto. In some embodiments, the bank BNK may include a transparent material (or substance). As the transparent material, for example, a polyamide resin, a polyimide resin, and the like may be included, but the present disclosure is not limited thereto. According to another embodiment, a reflective material layer may be formed on the bank BNK to further improve an efficiency of light emitted from each pixel PXL. The bank BNK may be provided and/or formed on the first insulating layer INS1.

The first electrode EL1 may be electrically connected to some components included in the pixel circuit layer PCL of the corresponding pixel PXL through the first contact hole CH1, for example, the second terminal DE of the driving transistor Tdr. The second electrode EL2 may be electrically connected to some components included in the pixel circuit layer PCL of the corresponding pixel PXL, for example, the driving voltage wires DVL and PL2 through the second contact hole CH2.

Each of the first and second electrodes EL1 and EL2 may be provided in each pixel area PXA of the pixels PXL, and may extend in the second direction DR2. The first electrode EL1 and the second electrode EL2 may be provided on the same surface, for example, on one surface (or upper surface) of the passivation layer PSV, and may be spaced from each other in the first direction DR1.

Each of the first and second electrodes EL1 and EL2 may be made of a material having a constant reflectance in order to allow light emitted from each of the light emitting elements LD to progress in an image display direction of the display device. Each of the first and second electrodes EL1 and EL2 may be made of a conductive material (or substance) having a constant reflectance. The conductive material (or substance) may include an opaque metal that is desirable for reflecting light emitted from the light emitting elements LD in the image display direction of the display device. As an opaque metal, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof may be included. In some embodiments, each of the first and second electrodes EL1 and EL2 may include a transparent conductive material (or substance). The transparent conductive material may include a conductive oxide such as an indium tin oxide (ITO), an indium zinc oxide (IZO), a zinc oxide (ZnO), or an indium tin zinc oxide (ITZO), and conductive polymer such as PEDOT (poly (3,4-ethylenedioxythiophene). When each of the first and second electrodes EL1 and EL2 includes the transparent conductive material, a separate conductive layer, which is made of an opaque metal for reflecting light emitted from the light emitting elements LD in the image display direction of the display device, may be additionally included. However, the material of each of the first and second electrodes EL1 and EL2 is not limited to the materials described above.

In one or more example embodiments, each of the first and second electrodes EL1 and EL2 may be provided and/or formed as a single film, but the present disclosure is not limited thereto. In some embodiments, each of the first and second electrodes EL1 and EL2 may be provided and/or formed as a multi-layered film in which at least two or more of metals, alloys, conductive oxides, and conductive polymers are stacked. Each of the first and second electrodes EL1 and EL2 may be formed of a multi-layered film of at least a double-layered film or more to minimize or reduce distortion caused by signal delay when transmitting a signal (or voltage) to respective end portions of each of the light emitting elements LD. For example, each of the first and second electrodes EL1 and EL2 may be formed of a multi-layered film sequentially stacked in an order of indium tin oxide (ITO)/silver (Ag)/indium tin oxide (ITO).

In one or more example embodiments of the present disclosure, the first electrode EL1 and the second electrode EL2 may receive an alignment signal (or alignment voltage) to function as an alignment electrode (or alignment wire) for alignment of the light emitting elements LD. For example, the first electrode EL1 may receive a first alignment signal (or first alignment voltage) from the first power line PL1 to function as a first alignment electrode (or first alignment wire), and the second electrode EL2 may receive a second alignment signal (or second alignment voltage) from the driving voltage wires DVL and PL2 to function as a second alignment electrode (or second alignment wire). Here, the first and second alignment signals (or alignment voltages) may be signals having a voltage difference and/or a phase difference in which the light emitting elements LD may be aligned between the first and second electrodes EL1 and EL2. At least one of the first and second alignment signals (or alignment voltages) may be an AC signal (or voltage), but the present disclosure is not limited thereto.

After the light emitting elements LD are arranged in the pixel area PXA of each pixel PXL, a portion of the first electrode EL1 disposed between adjacent pixels PXL in the second direction DR2 may be removed to individually (or independently) drive each pixel PXL. In some embodiments, after the light emitting elements LD are arranged in the pixel area PXA, the first electrode EL1 and the second electrode EL2 may function as driving electrodes for driving the light emitting elements LD. In one or more example embodiments of the present disclosure, the first electrode EL1 may be an anode electrode, and the second electrode EL2 may be a cathode electrode.

The intermediate pattern CP may be provided between the first electrode EL1 and the second electrode EL2 when viewed on a plane (e.g., in a plan view). A first side surface FS of the intermediate pattern CP may be disposed adjacent to the first electrode EL1, and a second side surface SS of the intermediate pattern CP may be disposed adjacent to the second electrode EL2. The first side surface FS of the intermediate pattern CP may be spaced from the first electrode EL1 with a first gap GAP1 in the first direction DR1, and the second side surface SS of the intermediate pattern CP may be spaced from the second electrode EL2 with a second gap GAP1 in the first direction DR1 (see, FIGS. 7-9).

In one or more example embodiments of the present disclosure, the first gap GAP1 between the first electrode EL1 and the first side surface FS of the intermediate pattern CP may be the same as the second gap GAP2 between the second electrode EL2 and the second side surface SS of the intermediate pattern CP. For example, the first gap GAP1 and the second gap GAP2 may be smaller than the length L of each light emitting element LD parallel to the extending direction of the light emitting elements LD. For example, when the length L of each of the light emitting elements LD is 3.5 μm, the first gap GAP1 and the second gap GAP2 may be smaller than 3.5 μm. However, the present disclosure is not limited thereto, and in some embodiments, the first gap GAP1 and the second gap GAP2 may be the same as the length L of each of the light emitting elements LD.

The intermediate pattern CP may be provided at the same layer as the first and second electrodes EL1 and EL2. For example, the intermediate pattern CP may be provided and/or formed on one surface (or upper surface) of the passivation layer PSV. In one or more example embodiments of the present disclosure, the intermediate pattern CP may be made of a material having a constant reflectance in order to allow light emitted to a rear surface of each of the light emitting elements LD to progress in the image display direction of the display device. The intermediate pattern CP may include the same material as that of the first and second electrodes EL1 and EL2. For example, the intermediate pattern CP may include a material having high reflectance, such as, aluminum (Al) or silver (Ag).

A width W of the intermediate pattern CP in the first direction DR1 may be designed to be larger than the length L of each light emitting element LD parallel to the extending direction of each light emitting element LD in order to reflect the light emitted from each light emitting element LD to the pixel circuit layer PCL in the image display direction (or front direction) of the display device. For example, when the length L of each of the light emitting elements LD is 3.5 μm, the width W of the intermediate pattern CP in the first direction DR1 may be designed to be larger than 3.5 μm. However, the present disclosure is not limited thereto, and in some embodiments, the width W of the intermediate pattern CP in the first direction DR1 may be designed to be the same as the length L of each of the light emitting elements LD.

The intermediate pattern CP, when viewed on a plane (e.g., in a plan view), may have a bar shape extending in the second direction DR2. In some embodiments, when viewed on a plane (e.g., in a plan view), the intermediate pattern CP may overlap the light emitting elements LD in the third direction DR3. The shape of the intermediate pattern CP may be variously changed within a range in which the intermediate pattern CP overlaps the light emitting elements LD in the third direction DR3.

Each of the light emitting elements LD may be a light-emitting element of a ultra-small size, for example, as small as a nano-scale to a micro-scale, made of an inorganic crystal material. For example, each of the light emitting elements LD may be a ultra-small light emitting element manufactured by an etching method or a ultra-small light emitting device manufactured by a growth method.

At least two to tens of light emitting elements LD may be arranged and/or provided in the pixel area PXA of each pixel PXL, but the number of the light emitting elements LD is not limited thereto. In some embodiments, the number of light emitting elements LD arranged and/or provided in the pixel area PXA may be variously changed.

Each of the light emitting elements LD may emit one of red, blue, and green color light and/or white light. Each of the light emitting elements LD may be arranged on the intermediate pattern CP between the first electrode E1 and the second electrode EL2 such that the extending direction (or the direction of the length L) thereof is parallel to the first direction DR1. The light emitting elements LD may be prepared in a form sprayed in a solution and then be placed in the pixel area PXA of each pixel PXL.

The light emitting elements LD may be disposed in the pixel area PXA of each pixel PXL through an inkjet printing method, a slit coating method, or other methods. For example, the light emitting elements LD may be mixed with a volatile solvent to be supplied in the pixel area PXA through the inkjet printing method or the slit coating method. In this case, when a corresponding alignment signal (or alignment voltage) is applied to each of the first and second electrodes EL1 and EL2 provided in the pixel area PXA, an electric field may be formed between the first side surface FS of the intermediate pattern CP and the second side surface SS of the intermediate pattern CP. Thus, the light emitting elements LD may be arranged between the first side surface FS of the intermediate pattern CP and the second side surface SS of the intermediate pattern CP.

After the light emitting elements LD are arranged, the light emitting elements LD are finally arranged and/or provided in the pixel area PXA of each pixel PXL by volatilizing the solvent or eliminating the solvent in another manner.

One end portion (for example, a p-type semiconductor layer) of each of the light emitting elements LD may be directly connected to the first electrode EL1, or may be connected to the first electrode EL1 through the first contact electrode CNE1. In some embodiments, the other end portion (for example, an n-type semiconductor layer) of each of the light emitting elements LD may be directly connected to the second electrode EL2, or may be connected to the second electrode EL2 through the second contact electrode CNE2.

When the light emitting elements LD are arranged in the pixel area PXA of each of the pixels PXL, a corresponding alignment signal (or alignment voltage) may be transmitted to each of the first and second electrodes EL1 and EL2. For example, a first alignment signal of negative polarity may be transmitted to the first electrode EL1, and a second alignment signal of positive polarity may be transmitted to the second electrode EL2. In this case, a charge of the positive polarity, which is opposite to the negative polarity, may be induced to the first side surface FS of the intermediate pattern CP adjacent to the first electrode EL1. A charge of the negative polarity, which is opposite to the positive polarity, may be induced to the second side surface SS of the intermediate pattern CP adjacent to the second electrode EL2. Thus, an electric field may be formed between the first side surface FS of the intermediate pattern CP and the second side surface SS of the intermediate pattern CP.

As described above, when the corresponding alignment signal (or alignment voltage) is transmitted to each of the first and second electrodes EL1 and EL2, an induced charge may be formed in the intermediate pattern CP disposed between the first electrode EL1 and the second electrode EL2, and thus, an electric field may be formed between the first side surface FS of the intermediate pattern CP and the second side surface SS of the intermediate pattern CP. The light emitting elements LD may be arranged on the intermediate pattern CP disposed between the first electrode EL1 and the second electrode EL2 by the electric field. When viewed on a plane (e.g., in a plan view) and a cross-section, the light emitting elements LD may overlap the intermediate pattern CP in the third direction DR3.

The above-described light emitting elements LD may be provided and/or formed on the first insulating layer INS1 on the intermediate pattern CP.

The first insulating layer INS1 may include an inorganic insulating film made of an inorganic material or an organic insulating film made of an organic material. In one or more example embodiments of the present disclosure, the first insulating layer INS1 may be formed as an inorganic insulating film that is desirable for protecting the light emitting elements LD from the pixel circuit layer PCL of each pixel PXL. For example, the first insulating layer INS1 may include at least one of metal oxides such as a silicon nitride (SiNx), a silicon oxide (SiOx), a silicon oxynitride (SiONx), and an aluminum oxide (AlOx), but is not limited thereto. In some embodiments, the first insulating layer INS1 may be formed as an organic insulating film that is desirable for flattening support surfaces of the light emitting elements LD.

The first insulating layer INS1 may include a first opening OPN1 exposing one region of the first electrode EL1 and a second opening OPN2 exposing a region of the second electrode EL2. The first electrode EL1 may directly contact and may be connected to the first contact electrode CNE1 by the first opening OPN1, and the second electrode EL2 may directly contact and may be connected to the second contact electrode CNE2 by the second opening OPN2.

The first insulating layer INS1 may cover the remaining regions except for one region of the first electrode EL1 and one region of the second electrode EL2 exposed by the first opening OPN1 and the second opening OPN2, respectively. In one or more example embodiments of the present disclosure, the first insulating layer INS1 may be provided on the intermediate pattern CP to completely cover the intermediate pattern CP.

The intermediate pattern CP may be completely covered by the first insulating layer INS1 to be electrically insulated from components adjacent to the intermediate pattern CP. For example, the intermediate pattern CP may be covered by the first insulating layer INS1 to be electrically insulated from each of the adjacent first and second electrodes EL1 and EL2 in the first direction DR1. The intermediate pattern CP may be covered by the first insulating layer INS1 to be electrically insulated from each of the first and second contact electrodes CNE1 and CNE2 disposed on the first insulating layer INS1 in a third direction DR3. In one or more example embodiments of the present disclosure, the intermediate pattern CP may be covered by the first insulating layer INS1 to be isolated from adjacent electrodes, for example, the first and second electrodes EL1 and EL2 and the first and second contact electrodes CNE1 and CNE2.

After the light emitting elements LD are arranged in the pixel area PXA of each of the pixels PXL, the intermediate pattern CP may be covered by the first insulating layer INS1 to not be affected by a signal or voltage (e.g., a set signal or voltage or a predetermined signal or voltage) applied to each of the adjacent electrodes. The intermediate pattern CP may reflect light emitted from the active layer 12 of each of the light emitting elements LD and proceeding toward the first insulating layer INS1 (or proceeding in a lower direction of each of the light emitting elements LD), in the image display direction (or front direction) of the display device. In other words, the intermediate pattern CP may reflect light emitted from each of the light emitting elements LD and proceeding in a rear direction (for example, an image non-display direction) of the display device opposite to the image display direction (or front direction), in the image display direction. Therefore, the light emitted from each of the light emitting elements LD may proceed in the image display direction of the display device without loss. As a result, the light emission efficiency of each pixel PXL may be improved by minimizing or reducing loss of the light emitted from each of the light emitting elements LD.

In one or more example embodiments of the present disclosure, the intermediate pattern CP may function as a reflecting member of reflecting the light emitted from the light emitting elements LD in the image display direction of the display device, together with the first and second electrodes EL1 and EL2

The second insulating layers INS2 may be provided and/or formed on each of the light emitting elements LD. The second insulating layer INS2 may be provided and/or formed on the light emitting elements LD, respectively, to cover a portion of an upper surface of each of the light emitting elements LD, and may exposes both end portions of each of the light emitting elements LD to the outside. The second insulating layer INS2 may be formed to have an independent insulating pattern in the pixel area PXA of each of the pixels PXL, but the present disclosure is not limited thereto.

The second insulating layer INS1 may be formed as a single film or multifilm, and may include an inorganic insulating film including at least one inorganic material or an organic insulating film including at least one organic material. The second insulating layer INS2 may further fix each of the light emitting elements LD arranged (or disposed) in the pixel area PXA of each of the pixels PXL. The second insulating layer INS2 may include an inorganic insulating film that is desirable for protecting the active layer 12 of each of the light emitting elements LD from the oxygen and moisture from the outside. However, the present disclosure is not limited thereto. In some embodiments, the second insulating layer INS2 may include an organic insulating layer including an organic material according to design conditions and the like of the display device to which the light emitting elements LD are applied.

The second insulating layer INS2 may be formed on the light emitting elements LD to prevent (or protect) the active layer 12 of each of the light emitting elements LD from contacting an external conductive material. The second insulating layer INS2 may cover only a portion of a surface (or outer circumferential surface) of each of the light emitting elements LD, and may expose both end portions of each of the light emitting elements LD to the outside.

The first contact electrode CNE1 electrically and stably connects the first electrode EL1 and one end portion of each of the light emitting elements LD, and the second contact electrode CNE2 electrically and stably connects the second electrode EL2 and the other end portion of each of the light emitting elements LD.

The first contact electrode CNE1 may be provided and/or formed on the first electrode EL1. The first contact electrode CNE1 may directly contact the first electrode EL1 to be connected to the first electrode EL1 through the first opening OPN1. In some embodiments, when a capping layer (not shown) is disposed on the first electrode EL1, the first contact electrode CNE1 may be disposed on the capping layer to be connected to the first electrode EL1 through the capping layer. Here, the capping layer may protect the first electrode EL1 from defects or the like generated during a manufacturing process of the display device, and may further enhance adhesion between the first electrode EL1 and the pixel circuit layer PCL disposed below the first electrode EL1. The capping layer may include a transparent conductive material such as an indium zinc oxide (IZO) to minimize or reduce loss of light emitted from each of the light emitting elements LD and then reflected in the image display direction of the display device by the first electrode EL1.

In one or more example embodiments, the first contact electrode CNE1 may be provided and/or formed on one end portion of each of the light emitting elements LD to be connected to one end portion of each of the light emitting elements LD. Accordingly, the first electrode EL1 and one end portion of each of the light emitting elements LD may be connected to each other through the first contact electrode CNE1.

The second contact electrode CNE2 may be provided and/or formed on the second electrode EL2. The second contact electrode CNE2 may directly contact the second electrode EL2 to be connected to the second electrode EL2 through the second opening OPN2. In some embodiments, when the capping layer is disposed on the second electrode EL2, the second contact electrode CNE2 may be disposed on the capping layer to be connected to the second electrode EL2 through the capping layer. In some embodiments, the second contact electrode CNE2 may be provided and/or formed on the other end portion of each of the light emitting elements LD to be connected to the other end portion of each of the light emitting elements LD. Accordingly, the second electrode EL2 and the other end portion of each of the light emitting elements LD may be connected to each other through the second contact electrode CNE2.

When viewed on a plane (e.g., in a plan view), the first contact electrode CNE1 may overlap at least one region of the intermediate pattern CP (for example, the first side surface FS) in the third direction DR3, and the second contact electrode CNE2 may overlap at least another region of the intermediate pattern CP (for example, the second side SS) in the third direction DR3. The first contact electrode CNE1 and the second contact electrode CNE2 may be spaced from each other on the same surface. The first contact electrode CNE1 and the second contact electrode CNE2 may be provided at the same layer, and may be formed through the same process, but the present disclosure is not limited thereto. In some embodiments, the first contact electrode CNE1 and the second contact electrode CNE2 may be provided in different layers, and may be formed through different processes. In one or more example embodiments of the present disclosure, the first contact electrode CNE1 and the second contact electrode CNE2 may be provided on the second insulating layer INS2, and may be spaced from each other at a set distance or a predetermined distance in the first direction DR1 on the second insulating layer INS2.

The first and second contact electrodes CNE1 and CNE2 may be made of various transparent conductive materials (or substances) so as to allow the light emitted from each of the light emitting elements LD and reflected by the first and second electrodes EL1 and EL2 and the intermediate pattern CP to proceed in the image display direction of the display device without loss. For example, the first and second contact electrodes CNE1 and CNE2 may include at least one of various transparent conductive materials including an indium tin oxide (ITO), an indium zinc oxide (IZO), and an zinc oxide (ZnO), an indium tin zinc oxide (ITZO), and may be configured to be substantially transparent or translucent to satisfy a transmittance (e.g., a set transmittance or a predetermined transmittance or transmittancy). However, the materials of the first and second contact electrodes CNE1 and CNE2 are not limited to the above-described example embodiments. In some embodiments, the first and second contact electrodes CNE1 and CNE2 may be made of various opaque conductive materials. The first and second contact electrodes CNE1 and CNE2 may be formed to have a single film or multi-film.

When viewed on a plane (e.g., in a plan view), each of the first and second contact electrodes CNE1 and CNE2 may have a bar shape extending along the second direction DR2, but the present disclosure is not limited thereto. In some embodiments, the shapes of the first and second contact electrodes CNE1 and CNE2 may be variously changed within a range that is electrically and stably connected to each of the light emitting elements LD. In some embodiments, the shapes of the first and second contact electrodes CNE1 and CNE2 may be variously changed in consideration of the connection relationship with electrodes disposed thereunder.

The third insulating layer INS3 may be provided and/or formed on the first and second contact electrodes CNE1 and CNE2. The third insulating layer INS3 may be an inorganic insulating film including an inorganic material or an organic insulating film including an organic material. For example, the third insulating layer INS3 may have a structure in which at least one inorganic insulating film and at least one organic insulating film are alternately stacked. The third insulating layer INS3 may be an encapsulation layer that wholly covers the display element layer DPL and blocks water or moisture from the outside from entering the display element layer DPL including the light emitting elements LD.

According to the above-described embodiment, the intermediate pattern CP may be disposed between the passivation layer PSV and the first insulating layer INS1 between the first electrode EL1 and the second electrode EL2 along the first direction, and the light emitting elements LD may be arranged on the first insulating layer INS1 on the intermediate pattern CP due to the induced charge formed in the intermediate pattern CP. As the intermediate pattern CP is disposed under the light emitting elements LD, the light emitted from the light emitting elements LD and proceeding in the lower direction (or the non-display direction of the display device) of the light emitting elements LD may be reflected in the image display direction of the display device by the intermediate pattern CP.

Therefore, as the light emitted from the light emitting elements LD proceed in the lower direction of the light emitting elements LD, and reflected in the image display direction of the display device by the intermediate pattern CP, an amount (or intensity) of light finally emitted from each of the pixels PXL increases, so that the light emission efficiency of each of the pixels PXL may be further improved.

Figure 10:
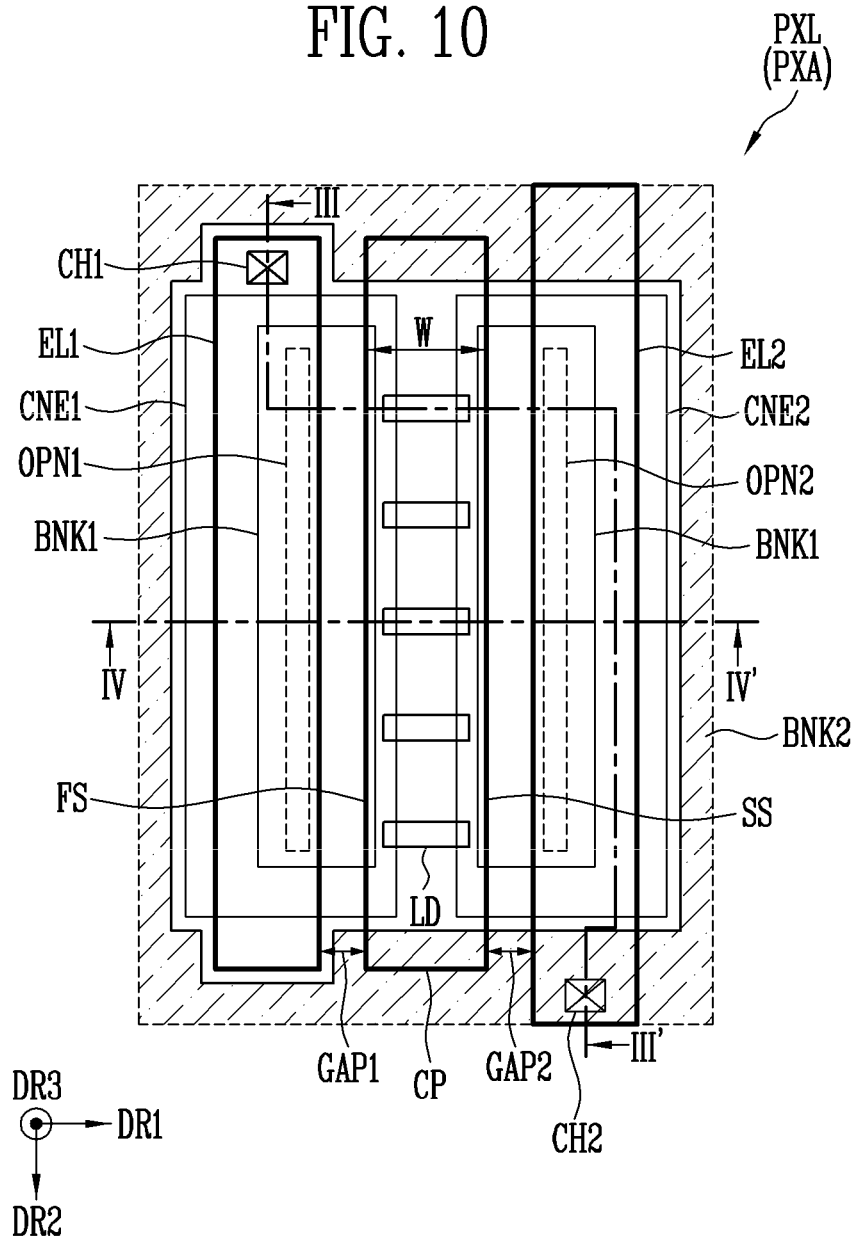
FIG. 10 schematically illustrates a top plan view of a pixel according to another example embodiment of the present disclosure.
Figure 11:
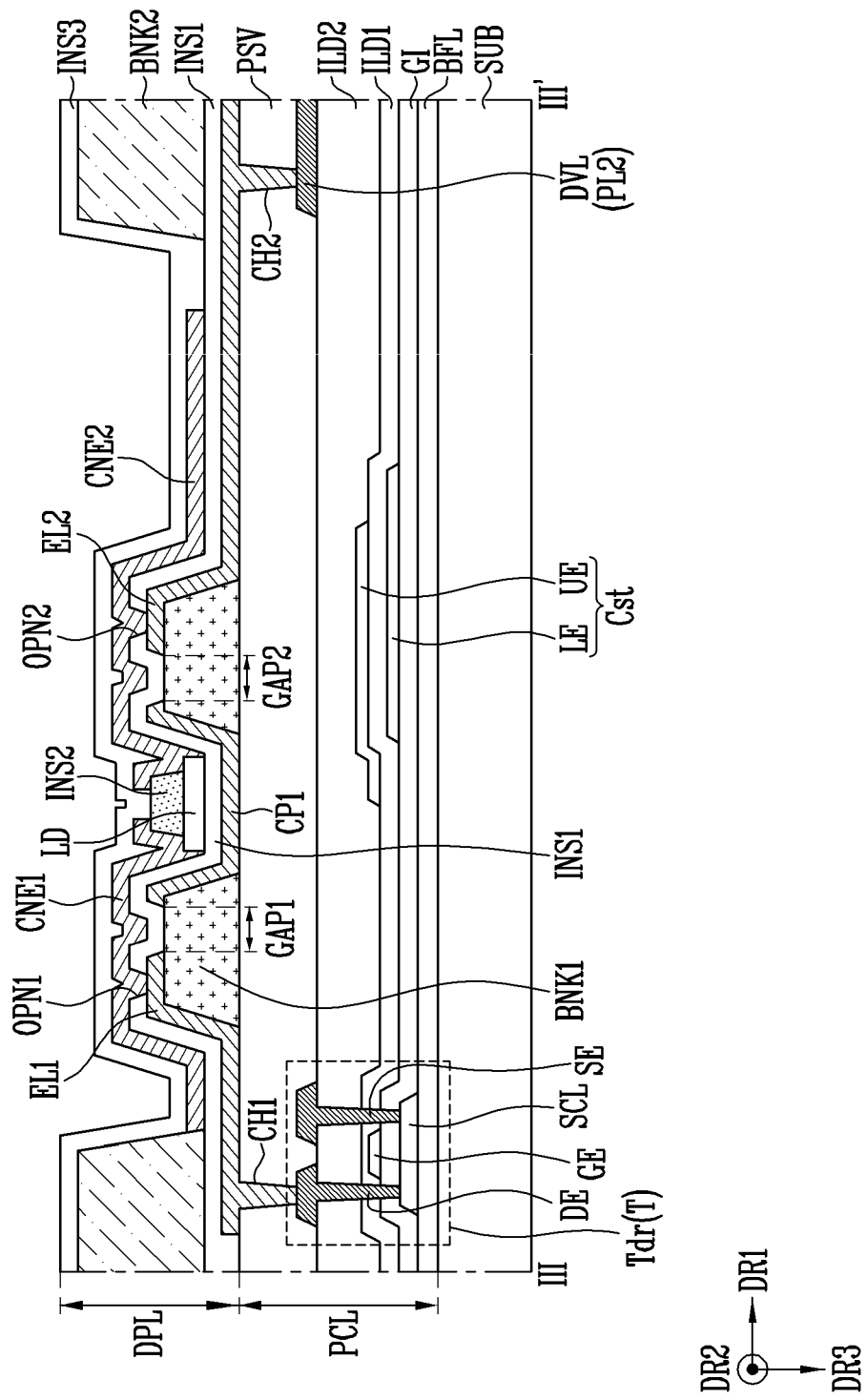
FIG. 11 illustrates a cross-sectional view taken along the line III-III' of FIG. 10.
Figure 12:
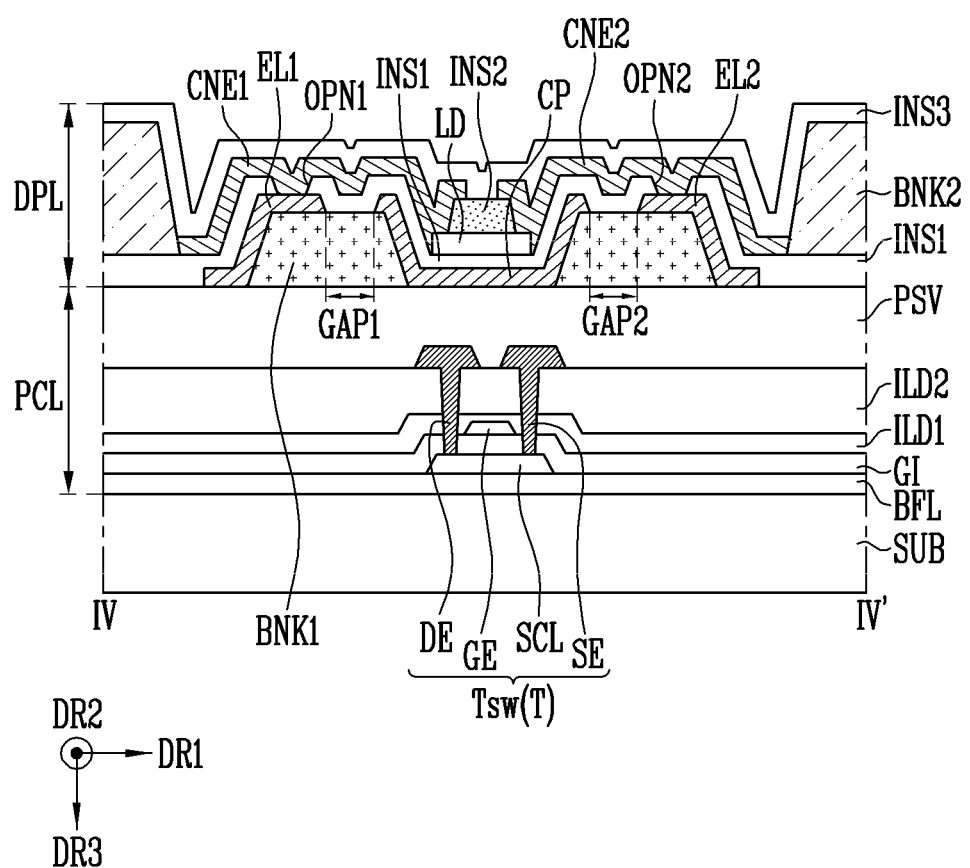
FIG. 12 illustrates a cross-sectional view taken along the line IV-IV' of FIG. 10.
Figure 13:
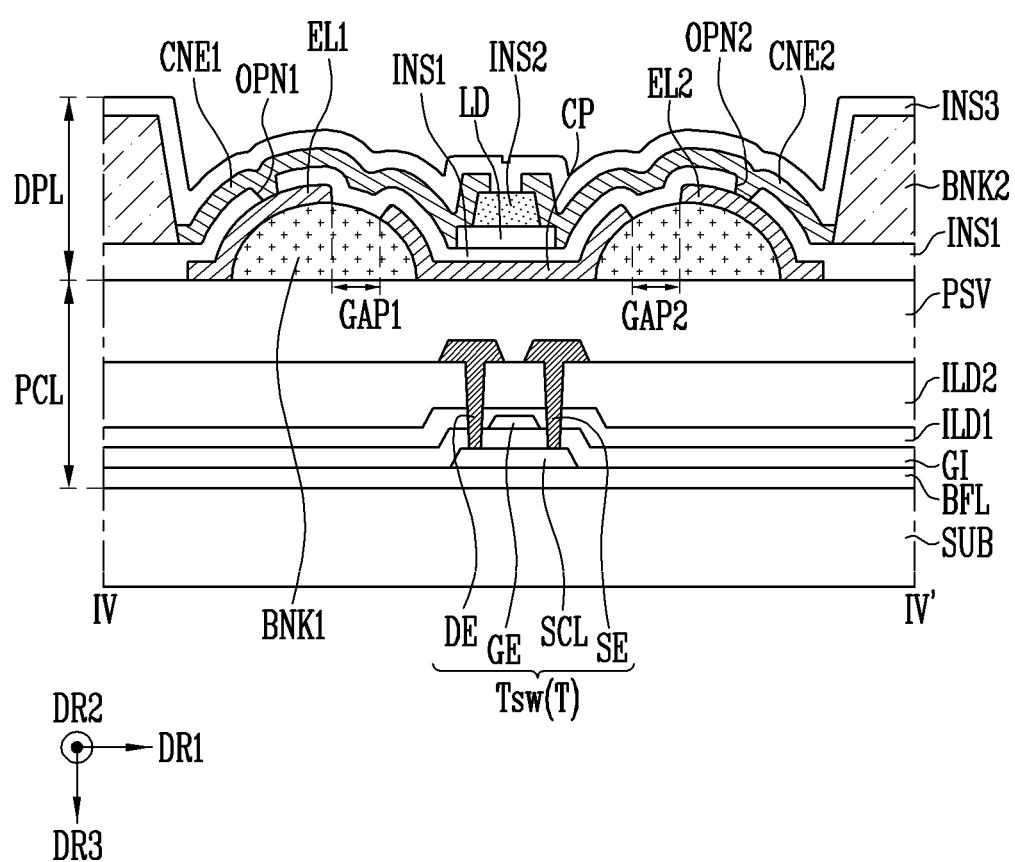
FIG. 13 illustrates a first bank pattern illustrated in FIG. 12 according to another example embodiment, and illustrates a cross-sectional view corresponding to the line IV-IV' of FIG. 10.
Figure 14:
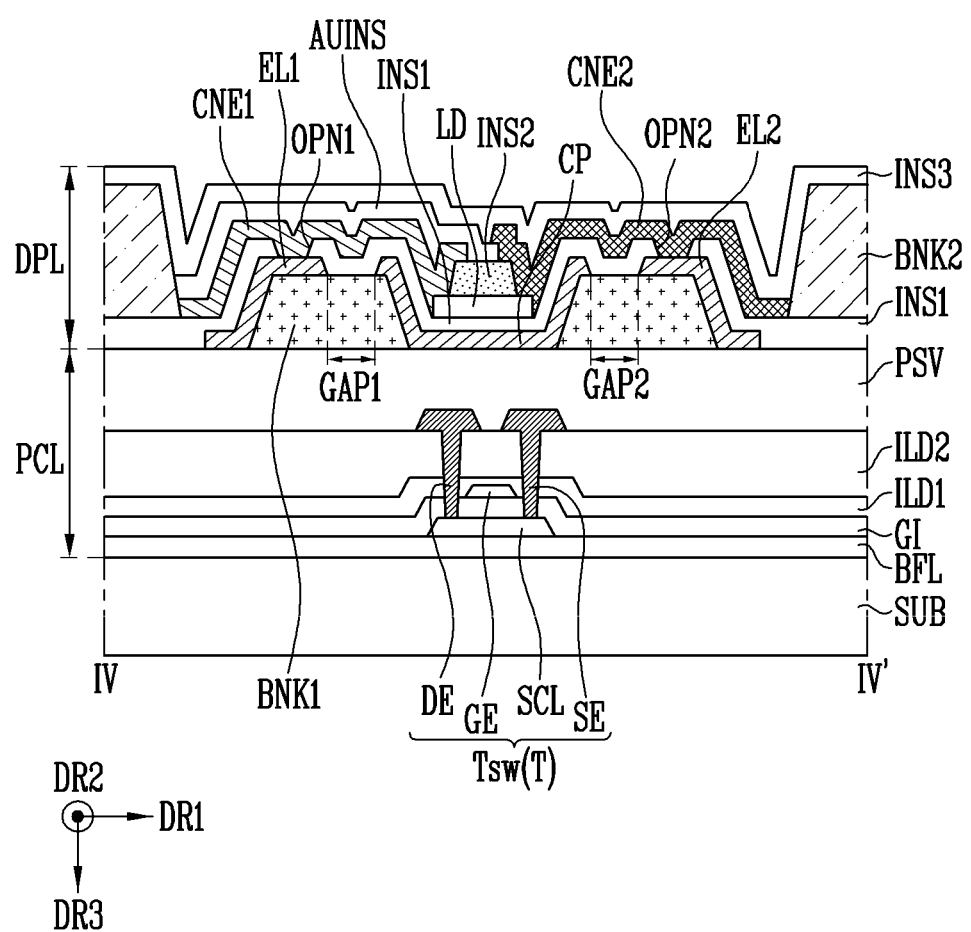
FIG. 14 illustrates a second contact electrode illustrated in FIG. 12 according to another example embodiment, and illustrates a cross-sectional view corresponding to the line IV-IV' of FIG. 10.

FIG. 10 schematically illustrates a top plan view of a pixel according to another example embodiment of the present disclosure, FIG. 11 illustrates a cross-sectional view taken along the line III-III' of FIG. 10, FIG. 12 illustrates a cross-sectional view taken along the line IV-IV' of FIG. 10, FIG. 13 illustrates a first bank pattern illustrated in FIG. 12 according to another example embodiment, and illustrates a cross-sectional view corresponding to the line IV-IV' of FIG. 10, and FIG. 14 illustrates a second contact electrode illustrated in FIG. 12 according to another example embodiment, and illustrates a cross-sectional view corresponding to the line IV-IV' of FIG. 10.

In relation to the example embodiments of FIG. 10-FIG. 14, differences from the above-described embodiments will be mainly described in order to avoid duplicate descriptions. Parts not specifically described in the present disclosure refer to the embodiments described above, the same reference numerals designate the same constituent elements, and the similar reference numerals designate the similar constituent elements.

Referring to FIG. 1A-FIG. 5, FIG. 6A, and FIG. 10-FIG. 14, the substrate SUB, the pixel circuit layer PCL, and the display element layer DPL may be disposed in the pixel area PXA of each pixel PXL.

In one or more example embodiments of the present disclosure, the display element layer DPL may include first and second bank patterns BNK1 and BNK2, the first and second electrodes EL1 and EL2, the intermediate pattern CP, the light emitting elements LD, the first and second contact electrodes CNE1 and CNE2, and the first to third insulating layers INS1 to INS3.

The first bank pattern BNK1 may be disposed in a light emitting region in which light is emitted from the pixel area PXA of each of the pixels PXL. The first bank pattern BNK1 may be a support member supporting each of the first and second electrodes EL1 and EL2 so as to change a surface profile (or shape) of each of the first and second electrodes EL1 and EL2 to direct light emitted from the light emitting elements LD in the image display direction of the display device.

The first bank pattern BNK1 may be provided and/or formed between the passivation layer PSV and a corresponding electrode in a light emitting region of a corresponding pixel PXL. For example, the first bank pattern BNK1 may be provided and/or formed between the passivation layer PSV and the first electrode EL1 and between the passivation layer PSV and the second electrode EL2, respectively.

The first bank pattern BNK1 may be an inorganic insulating film including an inorganic material or an organic insulating film including an organic material. In some embodiments, the first bank pattern BNK1 may include an organic insulating film of a single film and/or an inorganic insulating film of a single film, but the present disclosure is not limited thereto. In some embodiments, the first bank pattern BNK1 may be provided in a form of a multi-film in which at least one or more of organic insulating films and at least one or more of inorganic insulating films are stacked. However, the material of the first bank pattern BNK1 is not limited to the above-described embodiment, and in some embodiments, the first bank pattern BNK1 may include a conductive material.

The first bank pattern BNK1 may have a cross-section having a trapezoidal shape in which a width thereof becomes narrower from one surface (for example, an upper surface) of the passivation layer PSV toward an upper portion thereof along the third direction DR3, but the present disclosure is limited thereto. In some embodiments, as shown in FIG. 13, the first bank pattern BNK1 may have a curved cross-section having a semi-elliptical shape, a semi-circular shape (or a hemispherical shape), or the like in which the width thereof becomes narrower from one surface of the passivation layer PSV toward the upper portion thereof along the third direction DR3, When viewed on a cross section, the shape of the first bank pattern BNK1 is not limited to the above-described embodiments, and may be variously changed within a range capable of improving the efficiency of the light emitted from each of the light emitting elements LD. The first bank patterns BNK1 adjacent in the first direction DR1 may be disposed on the same surface on the passivation layer PSV, and may have the same height (or thickness) as each other in the third direction DR3.

The first bank pattern BNK1 may have a bar shape extending along the second direction DR2 when viewed on a plane (e.g., in a plan view), but the present disclosure is not limited thereto. In some embodiments, the shape of the first bank pattern BNK1 may be variously changed.

The second bank pattern BNK2 may be provided and/or formed in a peripheral area (e.g., an edge area) of the pixel area PXA of each pixel PXL. The second bank pattern BNK2 may have the same configuration as the bank BNK described with reference to FIG. 7-FIG. 9. Therefore, a description of the second bank pattern BNK2 is omitted.

Each of the first and second electrodes EL1 and EL2 may be provided and/or formed on the first bank pattern BNK1. For example, each of the first and second electrodes EL1 and EL2 may be provided and/or formed on one surface (for example, an upper surface) of the first bank pattern BNK1.

The intermediate pattern CP may be provided between the first electrode EL1 and the second electrode EL2 when viewed on a plane (e.g., in a plan view). In some embodiments, the intermediate pattern CP may be provided between the passivation layer PSV of the pixel circuit layer PCL and the first insulating layer INS1 when viewed on a cross section (or when viewed in the third direction DR3 of the substrate SUB).

The first side surface FS of the intermediate pattern CP may be disposed adjacent to the first electrode EL1, and the second side surface SS of the intermediate pattern CP may be disposed adjacent to the second electrode EL2. The first side surface FS of the intermediate pattern CP may be spaced from the first electrode EL1 with the first gap GAP1 therebetween in the first direction DR1, and the second side surface SS of the intermediate pattern CP may be spaced from the second electrode EL2 with the second gap GAP1 therebetween in the first direction DR1.

The intermediate pattern CP may be provided at the same layer as the first and second electrodes EL1 and EL2, and may be formed in the same process. The intermediate pattern CP and the first and second electrodes EL1 and EL2 may be made of a material having a constant reflectance so that the light emitted from the light emitting elements LD proceeds in the image display direction of the display device.

The first gap GAP1 between the first electrode EL1 and the first side surface FS of the intermediate pattern CP may correspond to the first bank pattern BNK1 (hereinafter referred to as a '(1-1)-th bank pattern') below the first electrode EL1. The second gap GAP2 between the second electrode EL2 and the second side surface SS of the intermediate pattern CP may correspond to the first bank pattern BNK1 (hereinafter referred to as a '(1-2)-th bank pattern') below the second electrode EL2.

In one or more example embodiments of the present disclosure, the first electrode EL1 and one side FS of the intermediate pattern CP may be spaced by the first gap GAP1 in the first direction DR1 on the (1-1)-the bank pattern BNK1. The second electrode EL2 and the other side SS of the intermediate pattern CP may be spaced by the second gap GAP2 in the first direction DR1 on the (1-2)-th bank pattern BNK1.

The first side surface FS of the intermediate pattern CP may overlap the (1-1)-th bank pattern BNK1, and the second side surface SS of the intermediate pattern CP may overlap the (1-2)-th bank pattern BNK1. The first side surface FS of the intermediate pattern CP may be provided and/or formed on one side surface of the (1-1)-the bank pattern BNK1 to have a surface profile corresponding to one side shape of the (1-1)-th bank pattern BNK1. For example, as shown in FIG. 11, when one side surface of the (1-1)-th bank pattern BNK1 has a slope (e.g., a set slope or a predetermined slope), the first side surface FS of the intermediate pattern CP may also have a surface profile corresponding to the slope. When one side surface of the (1-2)-th bank pattern BNK1 has a slope (e.g., a set slope or a predetermined slope), the second side surface SS of the intermediate pattern CP may also have a surface profile corresponding to the slope.

As described above, because each of the first side surface FS and the second side surface SS of the intermediate pattern CP has the surface profile corresponding to the shape of the first bank pattern BNK1 disposed thereunder, the light emitted from each of the light emitting elements LD may be reflected by each of the first side surface FS and the second side surface SS of the intermediate patterns CP to further proceed in the image display direction of the display device. In one or more example embodiments of the present disclosure, the intermediate pattern CP may function as a reflective member that guides the light emitted from the light emitting elements LD together with the first bank pattern BNK1 and the first and second electrodes EL1 and EL2 in a desired direction to improve the light efficiency of the display device.

The first insulating layer INS1 may be provided and/or formed on the passivation layer PSV on which the first and second electrodes EL1 and EL2 and the intermediate pattern CP are provided. The first insulating layer INS1 may cover the remaining region excluding one region of each of the first and second electrodes EL1 and EL2. As the intermediate pattern CP is covered by the first insulating layer INS1, the intermediate pattern CP may be electrically insulated from each of the first electrode EL1, the second electrode EL2, the first contact electrode CNE1, and the second contact electrode CNE2.

The first electrode EL1 and the first contact electrode CNE1 may be directly connected by the first opening OPN1 of the first insulating layer INS1, and the second electrode EL2 and the second contact electrode CNE2 may be directly connected by the second opening OPN2 of the second insulating layer INS2.

The first contact electrode CNE1 and the second contact electrode CNE2 may be provided at the same layer, and may be formed through the same process. However, the present disclosure is not limited thereto, and in some embodiments, the first and second contact electrodes CNE1 and CNE2 may be provided on different layers, and may be formed through different processes. When the first contact electrode CNE1 and the second contact electrode CNE2 are provided on different layers and are formed through different processes, as shown in FIG. 14, an auxiliary insulating layer AUINS may be provided and/or formed between the first contact electrode CNE1 and the second contact electrode CNE2. The auxiliary insulating layer AUINS may include the same material as that of the first insulating layer INS1 described with reference to FIG. 7-FIG. 9, or may include one or more materials selected from the materials illustrated as the constituent materials of the first insulating layer INS1. For example, the auxiliary insulating layer AUINS may be an inorganic insulating film including an inorganic material. The inorganic insulating film may include at least one of metal oxides such as a silicon nitride (SiNx), a silicon oxide (SiOx), a silicon oxynitride (SiONx), and an aluminum oxide (AlOx).

According to the above-described example embodiments, the intermediate pattern CP may be disposed on the passivation layer PSV between the first electrode EL1 and the second electrode EL2, and the light emitting elements LD may be arranged on the first insulating layer INS1 on the intermediate pattern CP due to an electric field formed by an electric charge induced in the intermediate pattern CP.

When the driving current flows from the first power line PL1 to the driving voltage wires DVL and PL2 by the driving transistor Tdr in each pixel PXL such that light is emitted from the light emitting elements LD, the intermediate pattern CP together with the first and second electrodes EL1 and EL2 may reflect light radially emitted from the light emitting elements LD in the image display direction of the display device. The intermediate pattern CP may reflect light emitted from the light emitting elements LD and proceeding in a lower direction of the light emitting elements LD in the image display direction of the display device.

Therefore, in the light emitted from the light emitting elements LD, as the light proceeding in the lower direction of the light emitting elements LD is reflected in the image display direction of the display device by the intermediate pattern CP, the light emission efficiency of each of the pixels PXL may be further improved.

Figure 15:
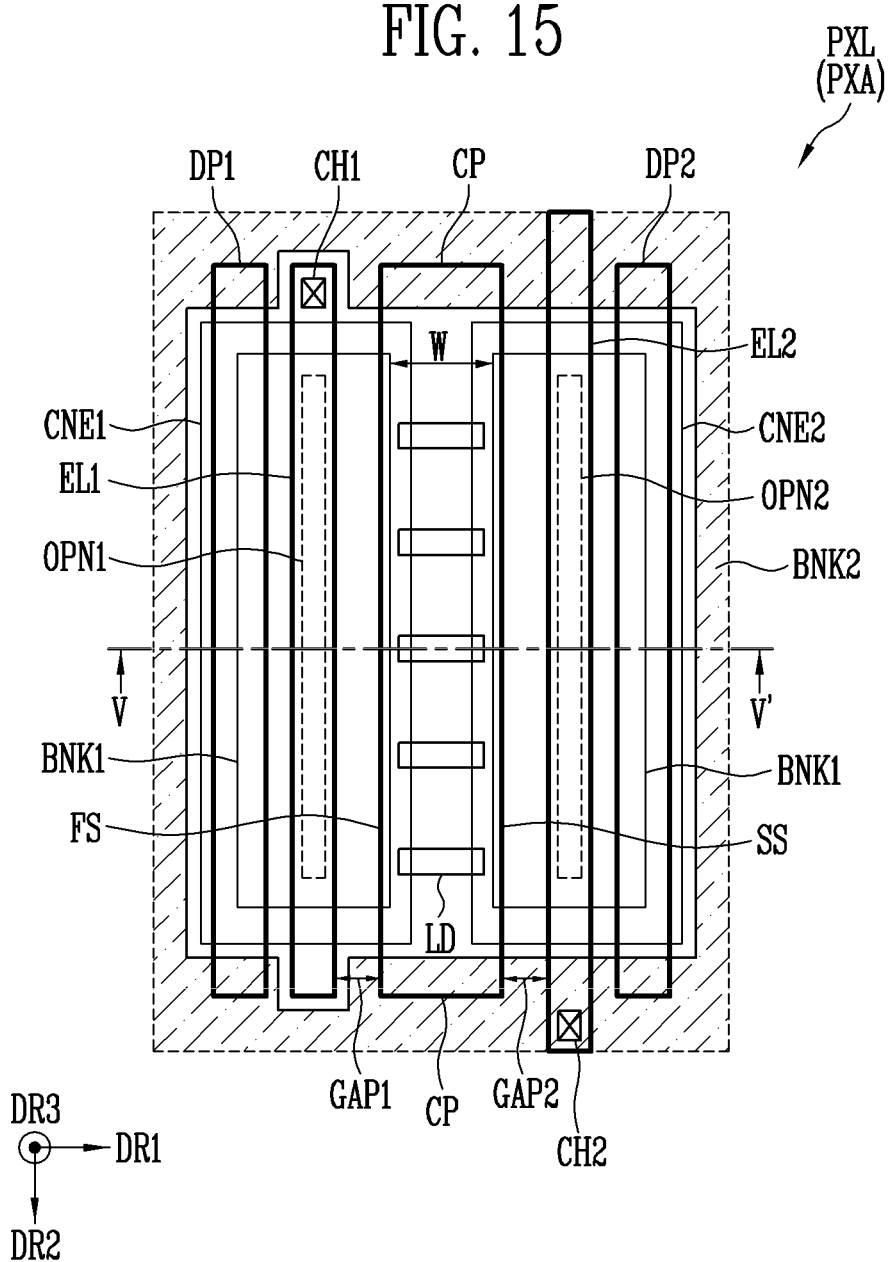
FIG. 15 schematically illustrates a top plan view of a pixel according to another example embodiment of the present disclosure.
Figure 16:
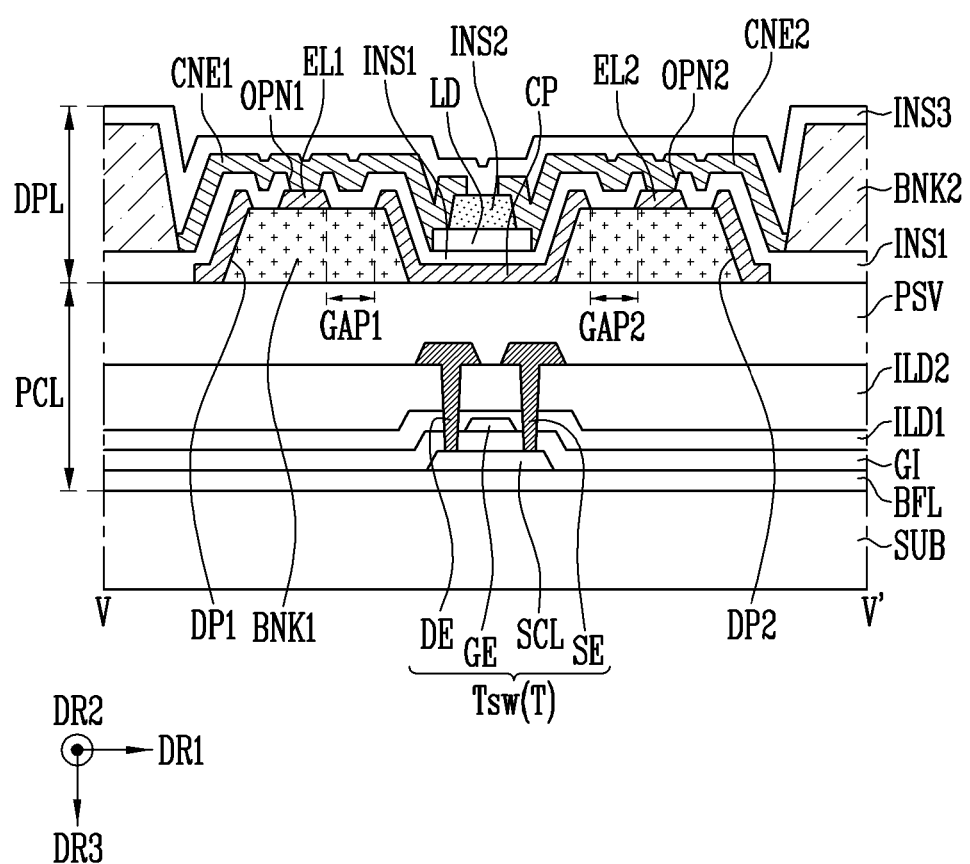
FIG. 16 illustrates a cross-sectional view taken along the line V-V' of FIG. 15.

FIG. 15 schematically illustrates a top plan view of a pixel according to another example embodiment of the present disclosure, and FIG. 16 illustrates a cross-sectional view taken along the line V-V' of FIG. 15.

The pixels illustrated in FIG. 15 and FIG. 16 may have configurations substantially the same as or similar to those of the pixels illustrated in FIG. 10 to-FIG. 14, except that first and second dummy patterns DP1 and DP2 are additionally disposed in the pixel area PXA of each pixel PXL.

Therefore, in relation to the pixels of FIG. 15 and FIG. 16, differences from the above-described example embodiments will be mainly described in order to avoid duplicate descriptions.

Referring to FIG. 1A to-FIG. 5, FIG. 15, and FIG. 16, the substrate SUB, the pixel circuit layer PCL, and the display element layer DPL may be disposed in the pixel area PXA of each pixel PXL.

In one or more example embodiments of the present disclosure, the display element layer DPL may include the first and second bank patterns BNK1 and BNK2, the first and second electrodes EL1 and EL2, the intermediate pattern CP, the light emitting elements LD, the first and second contact electrodes CNE1 and CNE2, the first to third insulating layers INS1 to INS3, and the first and second dummy patterns DP1 and DP2.

The first dummy pattern DP1 may be spaced from the first electrode EL1 in the first direction DR1. When viewed on a plane (e.g., in a plan view), the first electrode EL1 may be disposed between the first dummy pattern DP1 and the intermediate pattern CP. The intermediate pattern CP may be disposed to be adjacent to one side surface of the first electrode EL1 (for example, a right side surface on the plane), and the first dummy pattern DP1 may be disposed to be adjacent to the other side surface of the first electrode EL1 (for example, a left side surface on the plane).

The second dummy pattern DP2 may be spaced from the second electrode EL2 in the first direction DR1. When viewed on a plane (e.g., in a plan view), the second electrode EL2 may be disposed between the second dummy pattern DP2 and the intermediate pattern CP. The intermediate pattern CP may be disposed to be adjacent to one side surface of the second electrode EL2 (for example, a left side surface on the plane), and the second dummy pattern DP2 may be disposed to be adjacent to the other side surface of the second electrode EL2 (for example, a right side surface on the plane).

In one or more example embodiments of the present disclosure, the first and second dummy patterns DP1 and DP2, the first and second electrodes EL1 and EL2, and the intermediate pattern CP may be provided at the same layer, and may be formed in the same process. Further, the first and second dummy patterns DP1 and DP2, the first and second electrodes EL1 and EL2, and the intermediate pattern CP may include the same material. For example, the first and second dummy patterns DP1 and DP2, the first and second electrodes EL1 and EL2, and the intermediate pattern CP may include an opaque metal made of a material having a constant reflectance. The opaque metal may include a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof.

The first dummy pattern DP1 may be provided on the first bank pattern BNK1 (hereinafter referred to as the '(1-1)-th bank pattern') disposed under the first electrode EL1 to overlap the (1-1)-th bank pattern BNK1. At least one region (for example, the first side surface FS) of the intermediate pattern CP may be provided on the (1-1)-th bank pattern BNK1 to overlap the (1-1)-th bank pattern BNK1. The first electrode EL1 and the intermediate pattern CP (for example, the first side surface FS) may be spaced with a first gap GAP1 therebetween on the (1-1)-the bank pattern BNK1. The first electrode EL1 and the first dummy pattern DP1 may be spaced with a gap (e.g., a set gap or a predetermined gap) therebetween on the (1-1)-th bank pattern BNK1. On the (1-1)-th bank pattern BNK1, the same gap may be provided between the first electrode EL1 and the first dummy pattern DP1 and between the first electrode EL1 and the intermediate pattern CP, but the present disclosure is not limited thereto. In some embodiments, on the (1-1)-th bank pattern BNK1, different gaps may be provided between the first electrode EL1 and the first dummy pattern DP1 and between the first electrode EL1 and the intermediate pattern CP.

The second dummy pattern DP2 may be provided on the first bank pattern BNK1 (hereinafter referred to as the '(1-2)-th bank pattern') disposed under the second electrode EL2 to overlap the (1-2)-th bank pattern BNK1. At least another region (for example, the second side surface SS) of the intermediate pattern CP may be provided on the (1-2)-th bank pattern BNK1 to overlap the (1-2)-th bank pattern BNK1. The second electrode EL2 and the intermediate pattern CP (for example, the second side surface SS) may be spaced with a second gap GAP2 therebetween on the (1-2)-the bank pattern BNK1. The second electrode EL2 and the second dummy pattern DP2 may be spaced with a gap (e.g., a set gap or a predetermined gap) therebetween on the (1-2)-th bank pattern BNK1. On the (1-2)-th bank pattern BNK1, the same gap may be provided between the second electrode EL2 and the second dummy pattern DP2 and between the second electrode EL2 and the intermediate pattern CP, but the present disclosure is not limited thereto. In some embodiments, on the (1-2)-th bank pattern BNK1, different gaps may be provided between the second electrode EL2 and the second dummy pattern DP2 and between the second electrode EL2 and the intermediate pattern CP.

The first insulating layer INS1 may be provided and/or formed on the first and second dummy patterns DP1 and DP2, the first and second electrodes EL1 and EL2, and the intermediate pattern CP. The first insulating layer INS1 may cover the remaining region excluding one region of each of the first and second electrodes EL1 and EL2. As the intermediate pattern CP and the first and second dummy patterns DP1 and DP2 are covered by the first insulating layer INS1, the intermediate pattern CP and the first and second dummy patterns DP1 and DP2 may be electrically insulated from the first and second electrodes EL1 and EL2 and the first and second contact electrodes CNE1 and CNE2, respectively.

In one or more example embodiments of the present disclosure, the first and second dummy patterns DP1 and DP2 may reflect a portion of light radially proceeding in the light emitting elements LD in the image display direction of the display device. Accordingly, the first and second dummy patterns DP1 and DP2 may function as a reflective member that guides the light emitted from the light emitting elements LD together with the intermediate pattern CP and the first and second electrodes EL1 and EL2 in a desired direction to improve the light emission efficiency of the display device.

Figure 17:
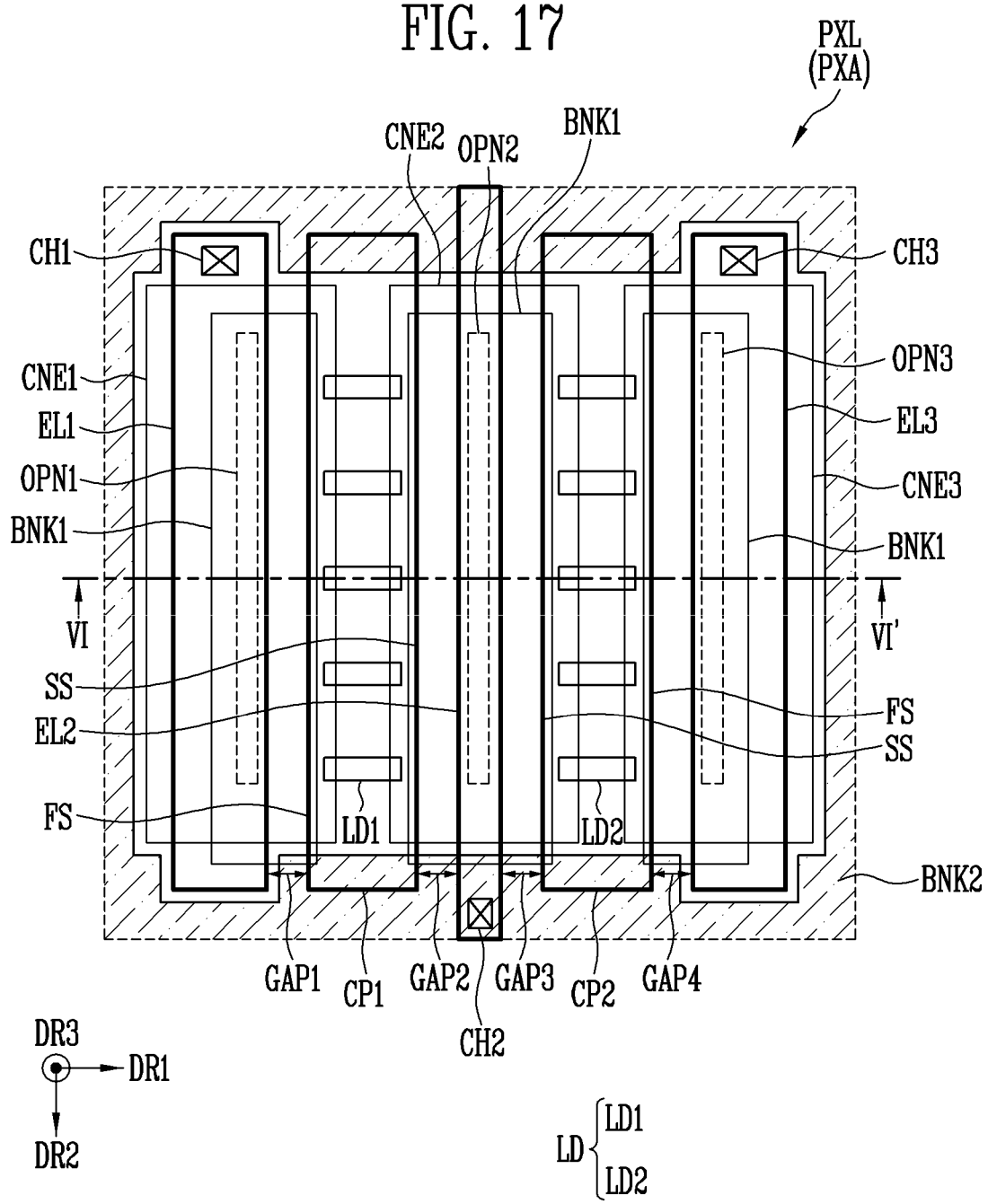
FIG. 17 schematically illustrates a top plan view of a pixel according to another example embodiment of the present disclosure.
Figure 18:
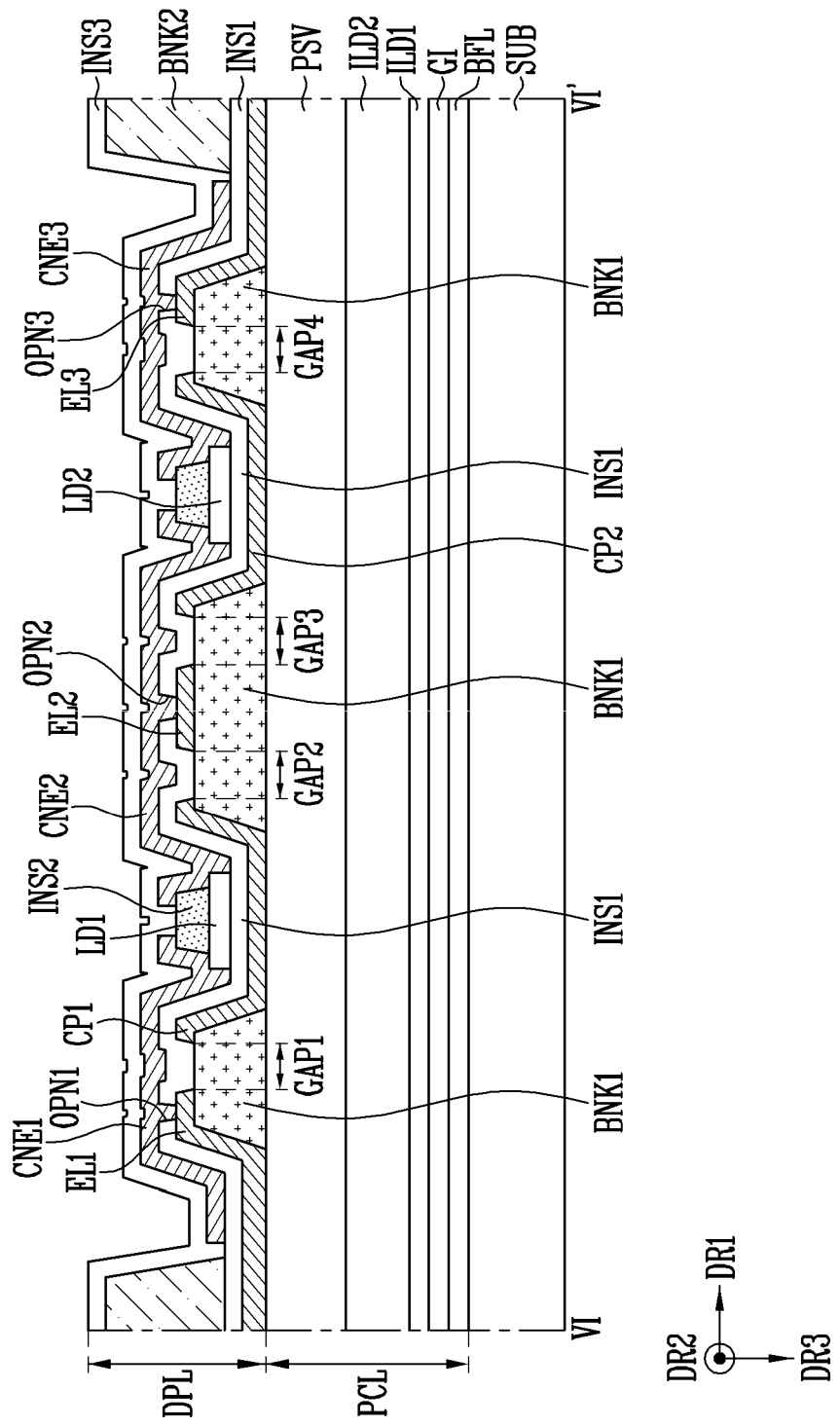
FIG. 18 illustrates a cross-sectional view taken along the line VI-VI' of FIG. 17.

FIG. 17 schematically illustrates a top plan view of a pixel according to another example embodiment of the present disclosure, and FIG. 18 illustrates a cross-sectional view taken along the line VI-VI' of FIG. 17.

The pixels illustrated in FIG. 17 and FIG. 18 may have configurations substantially the same as or similar to those of the pixels illustrated in FIG. 10-FIG. 14, except that the first to third electrodes EL1 to EL3 and the first and second intermediate patterns CP1 and CP2 are disposed in the pixel area PXA of each pixel PXL.

Therefore, in relation to the pixels of FIG. 17 and FIG. 18, differences from the above-described embodiment will be mainly described in order to avoid duplicate descriptions.

Referring to FIG. 1A-FIG. 5, FIG. 17, and FIG. 18, the substrate SUB, the pixel circuit layer PCL, and the display element layer DPL may be disposed in the pixel area PXA of each pixel PXL.

In one or more example embodiments of the present disclosure, the display element layer DPL may include the first and second bank patterns BNK1 and BNK2, first to third electrodes EL1 to EL3, the first and second intermediate patterns CP1 and CP2, the light emitting elements LD, first to third contact electrodes CNE1 to CNE3, and the first to third insulating layers INS1 to INS3.

The first electrode EL1, the second electrode EL2, and the third electrode EL3 may be sequentially arranged along the first direction DR1. The first electrode EL1 and the second electrode EL2 may be spaced with a gap (e.g., a set gap or a predetermined gap) therebetween along the first direction DR1, and the second electrode EL2 and third electrode EL3 may be spaced with a gap (e.g., a set gap or a predetermined gap) therebetween along the first direction DR1. In the pixel area PXA of each pixel PXL, the same gap may be provided between the first electrode EL1 and the second electrode EL2 and between the second electrode EL2 and the third electrode EL3. However, the present disclosure is not limited thereto, and in some embodiments, different gaps may be provided between the first electrode EL1 and the second electrode EL2 and between the second electrode EL2 and the third electrode EL3.

The second electrode EL2 may be disposed between the first electrode EL1 and the third electrode EL3. The first electrode EL1 may be electrically and/or physically connected to some components included in the pixel circuit layer PCL of the corresponding pixel PXL through the first contact hole CH1, for example, the driving transistor Tdr. The third electrode EL3 may be electrically and/or physically connected to the driving transistor Tdr through the third contact hole CH3. The second electrode EL2 may be electrically and/or physically connected to some components included in the pixel circuit layer PCL of the corresponding pixel PXL, for example, the driving voltage wires DVL and PL2 through the second contact hole CH2. In one or more example embodiments of the present disclosure, each of the first and third electrodes EL1 and EL3 may be an anode electrode of a corresponding pixel PXL, and the second electrode EL2 may be a cathode electrode of the pixel PXL.

Each of the first to third electrodes EL1 to EL3 may be provided and/or formed on the first bank pattern BNK1. For example, each of the first to third electrodes EL1 to EL3 may be provided and/or formed on one surface (for example, an upper surface) of the first bank pattern BNK1.

The first intermediate pattern CP1 may be disposed between the first electrode EL1 and the second electrode EL2 when viewed on a plane (e.g., in a plan view). The first intermediate pattern CP1 may be provided between the passivation layer PSV of the pixel circuit layer PCL and the first insulating layer INS1 when viewed on a cross section (or when viewed in the third direction DR3 of the substrate SUB). The first side surface FS of the first intermediate pattern CP1 may be disposed adjacent to the first electrode EL1, and the second side surface SS of the first intermediate pattern CP1 may be disposed adjacent to the second electrode EL2. The first side surface FS of the first intermediate pattern CP1 may be spaced from the first electrode EL1 with the first gap GAP1 therebetween in the first direction DR1, and the second side surface SS of the first intermediate pattern CP1 may be spaced from the second electrode EL2 with the second gap GAP1 therebetween in the first direction DR1. The first gap GAP1 and the second gap GAP2 may be the same, but the present disclosure is not limited thereto. In some embodiments, the first gap GAP1 and the second gap GAP2 may be different from each other.

The second intermediate pattern CP2 may be disposed between the second electrode EL2 and the third electrode EL3 when viewed on a plane (e.g., in a plan view). The second intermediate pattern CP2 may be provided between the passivation layer PSV of the pixel circuit layer PCL and the first insulating layer INS1 when viewed on a cross section (or when viewed in the third direction DR3 of the substrate SUB). The first side surface FS of the second intermediate pattern CP2 may be disposed adjacent to the third electrode EL3, and the second side surface SS of the second intermediate pattern CP2 may be disposed adjacent to the second electrode EL2. The first side surface FS of the second intermediate pattern CP2 may be spaced from the third electrode EL3 with a fourth gap GAP4 therebetween in the first direction DR1. The second side surface SS of the second intermediate pattern CP2 may be spaced from the second electrode EL2 with a third gap GAP3 therebetween in the first direction DR1. The third gap GAP3 and the fourth gap GAP4 may be identical to each other, but the present disclosure is not limited thereto. In some embodiments, the third gap GAP3 and the fourth gap GAP4 may be different from each other.

The first and second intermediate patterns CP1 and CP2 may be provided at the same layer as the first to third electrodes EL1 to EL3 to be formed in the same process. The first and second intermediate patterns CP1 and CP2 and the first to third electrodes EL1 to EL3 may be made of a material having a constant reflectance so that the light emitted from the light emitting elements LD proceeds in the image display direction of the display device.

The first gap GAP1 between the first electrode EL1 and the first side surface FS of the first intermediate pattern CP1 may correspond to the first bank pattern BNK1 (hereinafter referred to as the '(1-1)-th bank pattern') below the first electrode EL1. The second gap GAP2 between the second side surface SS of the first intermediate pattern CP1 and the second electrode EL2 may correspond to the first bank pattern BNK1 (hereinafter referred to as the '(1-2)-th bank pattern') below the second electrode EL2. The third gap GAP3 between the second electrode EL2 and the second side surface SS of the second intermediate pattern CP2 may correspond to the (1-2)-th bank pattern BNK1. The fourth gap GAP4 between the third electrode EL3 and the first side surface FS of the second intermediate pattern CP2 may correspond to the first bank pattern BNK1 (hereinafter referred to as a '(1-3)-th bank pattern') below the third electrode EL3.

The first side surface FS of the first intermediate pattern CP1 may overlap the (1-1)-th bank pattern BNK1, and the second side surface SS of the first intermediate pattern CP1 may overlap the (1-2)-th bank pattern BNK1. The first side surface FS of the first intermediate pattern CP1 may be provided and/or formed on one side surface of the (1-1)-the bank pattern BNK1 to have a surface profile corresponding to one side shape of the (1-1)-th bank pattern BNK1. The second side surface SS of the first intermediate pattern CP1 may be provided and/or formed on one side surface of the (1-2)-the bank pattern BNK1 to have a surface profile corresponding to one side shape of the (1-2)-th bank pattern BNK1.

The first side surface FS of the second intermediate pattern CP2 may overlap the (1-3)-th bank pattern BNK1, and the second side surface SS of the second intermediate pattern CP2 may overlap the (1-2)-th bank pattern BNK1. The first side surface FS of the second intermediate pattern CP2 may be provided and/or formed on one side surface of the (1-3)-the bank pattern BNK1 to have a surface profile corresponding to one side shape of the (1-3)-th bank pattern BNK1. The second side surface SS of the second intermediate pattern CP2 may be provided and/or formed on the other side surface of the (1-2)-the bank pattern BNK1 to have a surface profile corresponding to a shape of the other side surface of the (1-2)-th bank pattern BNK1.

As described above, because the first side surface FS and the second side surface SS of each of the first and second intermediate patterns CP1 and CP2 have the surface profile corresponding to the shape of the first bank pattern BNK1 disposed thereunder, the light emitted from each of the light emitting elements LD may be reflected by each of the first side surface FS and the second side surface SS of each of the first and second intermediate patterns CP1 and CP2 to further proceed in the image display direction of the display device. In one or more example embodiments of the present disclosure, each of the first and second intermediate patterns CP1 and CP2 may function as a reflective member that guides the light emitted from the light emitting elements LD together with the first bank pattern BNK1 and the first to third electrodes EL1 to EL3 in a desired direction to improve the light efficiency of the display device.

The first insulating layer INS1 may be provided and/or formed on the first and second intermediate patterns CP1 and CP2 and the first to third electrodes EL1 to EL3. The first insulating layer INS1 may include a first opening OPN1 exposing one region of the first electrode EL1, a second opening OPN2 exposing a region of the second electrode EL2, and a third opening OPN3 exposing a region of the third electrode EL3. The first and second intermediate patterns CP1 and CP2 may be completely covered by the first insulating layer INS1 to be electrically insulated from adjacent one of the first to third electrodes EL1 to EL3 in the first direction DR1. The first and second intermediate patterns CP1 and CP2 may be completely covered by the first insulating layer INS1 to be electrically insulated from adjacent one of the first to third contact electrodes CNE1 to CNE3 in the third direction DR3.

The light emitting elements LD may include first light emitting elements LD1 and second light emitting elements LD2.

The first light emitting elements LD1 may be arranged on the first insulating layer INS1 on the first intermediate pattern CP1 between the first electrode EL1 and the second electrode EL2. The second light emitting elements LD2 may be arranged on the first insulating layer INS1 on the second intermediate pattern CP2 between the second electrode EL2 and the third electrode EL3.

When the light emitting elements LD are arranged in the pixel area PXA of each of the pixels PXL, a corresponding alignment signal (or alignment voltage) may be transmitted to each of the first to third electrodes EL1 to EL3. For example, a first alignment signal of negative polarity may be transmitted to each of the first and third electrodes EL1 and EL3, and a second alignment signal of positive polarity may be transmitted to the second electrode EL2. In this case, a charge of the positive polarity opposite to the negative polarity may be induced to the first side surface FS of the first intermediate pattern CP1 adjacent to the first electrode EL1, and a charge of the negative polarity opposite to the positive polarity may be induced to the second side surface SS of the first intermediate pattern CP1 adjacent to the second electrode EL2. A charge of the positive polarity opposite to the negative polarity may be induced to the first side surface FS of the second intermediate pattern CP2 adjacent to the third electrode EL3, and a charge of the negative polarity opposite to the positive polarity may be induced to the second side surface SS of the second intermediate pattern CP2 adjacent to the second electrode EL2.

Thus, an electric field may be formed between the first side surface FS and the second side surface SS of each of the first and second intermediate patterns CP1 and CP2. The first light emitting elements LD1 may be arranged on the first insulating layer INS1 on the first intermediate pattern CP1 due to the electric field formed between the first side surface FS and the second side surface SS of the first intermediate pattern CP1, and the second light emitting elements LD2 may be arranged on the first insulating layer INS1 on the second intermediate pattern CP2 due to the electric field formed between the first side surface FS and the second side surface SS of the second intermediate pattern CP2.

The first electrode EL1 and the first contact electrode CNE1 may be directly connected by the first opening OPN1 of the first insulating layer INS1, the second electrode EL2 and the second contact electrode CNE2 may be directly connected by the second opening OPN2 of the first insulating layer INS1, and the third electrode EL3 and the third contact electrode CNE3 may be directly connected by the third opening OPN3 of the first insulating layer INS1.

The first to third contact electrodes CNE1 to CNE3 may be provided at the same layer with each other and formed through the same process. The first to third contact electrodes CNE1 to CNE3 may be spaced from each other in the first direction DR1. Each of the first to third contact electrodes CNE1 to CNE3 may have a bar shape extending in the second direction DR2.

When the driving current flows from the first power line PL1 to the driving voltage wires DVL and PL2 by the driving transistor Tdr in each pixel PXL such that light is emitted from the light emitting elements LD, the first and second intermediate patterns CP1 and CP2 together with the first to third electrodes EL1 to EL3 may reflect light radially emitted from the light emitting elements LD in the image display direction of the display device. Each of the first and second intermediate patterns CP1 and CP2 may reflect light emitted from the light emitting elements LD and proceeding in a downward direction of the light emitting elements LD in the image display direction of the display device.

Therefore, in the light emitted from the light emitting elements (LD), as even the light proceeding in the lower direction of the light emitting elements LD is reflected in the image display direction of the display device by the intermediate patterns CP1 and CP2, an amount (or intensity) of light finally emitted from each of the pixels PXL increases, so that the light efficiency of each of the pixels PXL may be further improved.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by on the technical scope of the accompanying claims.

What is claimed is:

1. A pixel comprising:
   a first electrode and a second electrode spaced from each other in a first direction on a substrate;
   a plurality of light emitting elements between the first electrode and the second electrode;
   an intermediate pattern located between the first electrode and the second electrode in the first direction and located between the substrate and the plurality of light emitting elements in a thickness direction of the substrate;
   a first contact electrode electrically connecting one end portion of each of the light emitting elements and the first electrode; and
   a second contact electrode electrically connecting an other end portion of each of the light emitting elements and the second electrode,
   wherein one side of the intermediate pattern is spaced from the first electrode with a first gap therebetween in the first direction, and an other side of the intermediate pattern is spaced from the second electrode with a second gap therebetween in the first direction, and
   wherein the intermediate pattern comprises a same material as that of the first and second electrodes.

2. The pixel of claim 1, wherein in a plan view, the intermediate pattern overlaps the light emitting elements.

3. The pixel of claim 2, wherein the first and second electrodes and the intermediate pattern are at a same layer.

4. The pixel of claim 2, wherein the first gap and the second gap are same as or different from each other.

5. The pixel of claim 4, wherein each of the first and second gaps is smaller than a length of each of the light emitting elements parallel to an extending direction of each of the light emitting elements.

6. The pixel of claim 5, wherein a width of the intermediate pattern in the first direction is greater than the length of each of the light emitting elements.

7. The pixel of claim 2, further comprising an insulating layer on the first and second electrodes and the intermediate pattern and under the light emitting elements,
   wherein the insulating layer exposes a portion of the first electrode and a portion of the second electrode, and completely covers the intermediate pattern.

8. The pixel of claim 7, wherein the intermediate pattern is covered by the insulating layer to be electrically insulated from the first electrode, the second electrode, the first contact electrode, and the second contact electrode.

9. The pixel of claim 7, wherein the intermediate pattern reflects light emitted from each of the light emitting elements in one direction.

10. The pixel of claim 9, further comprising:
a first bank pattern between the substrate and the first electrode; and
a second bank pattern between the substrate and the second electrode,
wherein the one side of the intermediate pattern corresponds to the first bank pattern, and the other side of the intermediate pattern corresponds to the second bank pattern.

11. The pixel of claim 10, wherein
the first electrode and the one side of the intermediate pattern are spaced from each other with the first gap therebetween on the first bank pattern, and
the second electrode and the other side of the intermediate pattern are spaced from each other with the second gap therebetween on the second bank pattern.

12. The pixel of claim 11, further comprising:
a first dummy pattern spaced from the first electrode in the first direction; and
a second dummy pattern spaced from the second electrode in the first direction,
wherein the first electrode is located between the first dummy pattern and the intermediate pattern in a plan view, and
the second electrode is located between the second dummy pattern and the intermediate pattern in a plan view.

13. The pixel of claim 12, wherein the first and second dummy patterns comprise the same material as that of the first and second electrodes and are at the same layer as the first and second electrodes.

14. The pixel of claim 13, wherein the insulating layer is on the first and second dummy patterns to completely cover the first and second dummy patterns.

15. The pixel of claim 13, wherein the first and second dummy patterns are to reflect light emitted from the light emitting elements in the one direction.

16. A display device comprising:
a plurality of pixels on a substrate, wherein each of the pixels comprises:
a first electrode and a second electrode spaced from each other in a first direction on the substrate;
a plurality of light emitting elements between the first electrode and the second electrode;
an intermediate pattern located between the first electrode and the second electrode in the first direction and located between the substrate and the plurality of light emitting elements in a thickness direction of the substrate;
a first contact electrode electrically connecting one end portion of each of the light emitting elements and the first electrode; and
a second contact electrode electrically connecting an other end portion of each of the light emitting elements and the second electrode, wherein one side of the intermediate pattern is spaced from the first electrode with a first gap therebetween in the first direction, and an other side of the intermediate pattern is spaced from the second electrode with a second gap therebetween in the first direction, and
wherein the intermediate pattern comprises a same material as that of the first and second electrodes.

17. The display device of claim 16, wherein
in a plan view, the intermediate pattern overlaps the light emitting elements, and
the first and second electrodes and the intermediate pattern are at a same layer.

18. The display device of claim 17, further comprising an insulating layer on the first and second electrodes and the intermediate pattern and under the light emitting elements,
wherein the insulating layer exposes a portion of the first electrode and a portion of the second electrode, and completely covers the intermediate pattern.

19. The display device of claim 18, wherein the intermediate pattern is covered by the insulating layer to be electrically insulated from the first electrode, the second electrode, the first contact electrode, and the second contact electrode.

20. The display device of claim 19, wherein the intermediate pattern is to reflect light emitted from each of the light emitting elements in display device direction.

* * * * *